(12) United States Patent
Anémian et al.

(10) Patent No.: US 9,394,406 B2
(45) Date of Patent: Jul. 19, 2016

(54) POLYMERS CONTAINING SUBSTITUTED BENZODITHIOPHENE UNITS, BLENDS COMPRISING THESE POLYMERS, AND DEVICES COMPRISING THESE POLYMERS OR BLENDS

(75) Inventors: Rémi Manouk Anémian, Seoul (KR); Aurélie Ludemann, Frankfurt am main (DE)

(73) Assignee: Merck Patent GmbH, Darmstadt (DE)

( * ) Notice: Subject to any disclaimer, the term of this patent is extended or adjusted under 35 U.S.C. 154(b) by 367 days.

(21) Appl. No.: 13/812,950

(22) PCT Filed: Jul. 19, 2011

(86) PCT No.: PCT/EP2011/003594
§ 371 (c)(1),
(2), (4) Date: Jan. 29, 2013

(87) PCT Pub. No.: WO2012/013310
PCT Pub. Date: Feb. 2, 2012

(65) Prior Publication Data
US 2013/0126855 A1 May 23, 2013

(30) Foreign Application Priority Data
Jul. 29, 2010 (DE) .......................... 10 2010 032 737

(51) Int. Cl.
*C08L 65/00* (2006.01)
*C08G 75/06* (2006.01)
*C08G 61/02* (2006.01)
*C08G 61/12* (2006.01)
(Continued)

(52) U.S. Cl.
CPC ............... *C08G 75/06* (2013.01); *C08G 61/02* (2013.01); *C08G 61/124* (2013.01); *C08L 65/00* (2013.01); *C09K 11/06* (2013.01); *H01L 51/0036* (2013.01); *H01L 51/0043* (2013.01); *H05B 33/14* (2013.01); *C08G 2261/124* (2013.01); *C08G 2261/148* (2013.01); *C08G 2261/149* (2013.01); *C08G 2261/3142* (2013.01); *C08G 2261/3162* (2013.01); *C08G 2261/3223* (2013.01); *C08G 2261/3241* (2013.01);
(Continued)

(58) Field of Classification Search
None
See application file for complete search history.

(56) References Cited

U.S. PATENT DOCUMENTS

2005/0082525 A1* 4/2005 Heeney et al. .................. 257/40
2008/0102559 A1* 5/2008 Ong et al. ....................... 438/99
(Continued)

FOREIGN PATENT DOCUMENTS

EP          1916250 A1    4/2008
WO    WO-2010036494 A1    4/2010
WO    WO-2011131280 A1   10/2011

OTHER PUBLICATIONS

Huo, Lijun, et al., "A Polybenzo[1,2-b:4,5-b']Dithiophene Derivative with Deep HOMO Level and its Application in High-Performance Polymer Solar Cells", Angew. Chem. Ed., vol. 49, (2010), pp. 1500-1503.

(Continued)

*Primary Examiner* — Robert S Loewe
(74) *Attorney, Agent, or Firm* — Drinker Biddle & Reath LLP

(57) ABSTRACT

The present invention relates to polymers containing substituted benzodithiophene units and to blends which comprise the polymers according to the invention. The invention is also directed to the use of the polymers and blends according to the invention in organic electronic devices and to these devices themselves.

23 Claims, 2 Drawing Sheets

Figure 1:
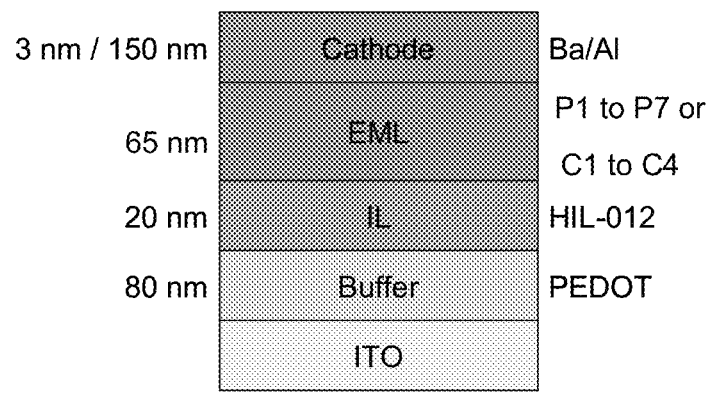

(51) Int. Cl.
 *C09K 11/06* (2006.01)
 *H01L 51/00* (2006.01)
 *H05B 33/14* (2006.01)
 *H01L 51/05* (2006.01)
 *H01L 51/42* (2006.01)
 *H01L 51/50* (2006.01)

(52) U.S. Cl.
 CPC  *C08G2261/3243* (2013.01); *C08G 2261/3422* (2013.01); *C08G 2261/411* (2013.01); *C08G 2261/51* (2013.01); *C08G 2261/5222* (2013.01); *C08G 2261/91* (2013.01); *C08G 2261/92* (2013.01); *C09K 2211/1458* (2013.01); *H01L 51/0558* (2013.01); *H01L 51/42* (2013.01); *H01L 51/5048* (2013.01); *Y02E 10/549* (2013.01)

(56) References Cited

U.S. PATENT DOCUMENTS

| | | | |
|---|---|---|---|
| 2008/0103286 A1* | 5/2008 | Ong et al. | 528/373 |
| 2009/0184635 A1* | 7/2009 | Pan et al. | 313/504 |
| 2009/0242878 A1* | 10/2009 | Pan et al. | 257/40 |
| 2010/0078074 A1* | 4/2010 | Yang et al. | 136/263 |
| 2011/0049477 A1* | 3/2011 | Meng et al. | 257/40 |
| 2011/0124822 A1* | 5/2011 | Yu et al. | 525/389 |

OTHER PUBLICATIONS

International Search Report for PCT/EP2011/003594 mailed Dec. 21, 2011.

* cited by examiner

POLYMERS CONTAINING SUBSTITUTED BENZODITHIOPHENE UNITS, BLENDS COMPRISING THESE POLYMERS, AND DEVICES COMPRISING THESE POLYMERS OR BLENDS

RELATED APPLICATIONS

This application is a national stage application (under 35 U.S.C. §371) of PCT/EP2011/003594, filed Jul. 19, 2011, which claims benefit of German Application No. 10 2010 032 737.9, filed Jul. 29, 2010. Both are incorporated herein by reference in their entirety.

The present invention relates to polymers comprising substituted benzodithiophene units and to blends which comprise the polymers according to the invention. The invention is also directed to the use of the polymers and blends according to the invention in organic electronic devices and to these devices themselves.

Electronic devices which comprise organic, organometallic and/or polymeric semiconductors are being used ever more frequently in commercial products or are just about to be introduced onto the market. Examples which may be mentioned here are charge-transport materials on an organic basis (for example hole transporters based on triarylamine) in photocopiers and organic or polymeric light-emitting diodes (OLEDs or PLEDs) in display devices or organic photoreceptors in copiers. Organic solar cells (O-SCs), organic field-effect transistors (O-FETs), organic thin-film transistors (O-TFTs), organic integrated circuits (O-ICs), organic optical amplifiers and organic laser diodes (O-lasers) are in an advanced stage of development and may achieve major importance in the future.

Many of these electronic devices have, irrespective of the respective application, the following general layer structure, which can be adapted for the respective application:

(1) substrate,
(2) electrode, frequently metallic or inorganic, but also comprising organic or polymeric conductive materials,
(3) charge-injection layer(s) or interlayer(s), for example for compensation of the unevenness of the electrode ("planarisation layer"), frequently comprising a conductive, doped polymer,
(4) organic semiconductor,
(5) optionally further charge-transport or charge-injection or charge-blocking layers,
(6) counterelectrode, materials as mentioned under (2),
(7) encapsulation.

The above arrangement represents the general structure of an organic electronic device, where various layers may be combined, meaning that in the simplest case an arrangement results from two electrodes, between which an organic layer is located. The organic layer in this case fulfils all functions, including the emission of light. A system of this type is described, for example, in WO 90/13148 A1 on the basis of poly(p-phenylenes).

This individual layer can be, for example, a copolymer, in which case the corresponding functional units are present in the main chain and/or side chain of the polymer, or it can be a polymer blend, in which case different polymers contain one or more functional units as structural units. Mixtures of the two variants with functional low-molecular-weight compounds are also known. However, all these simple single-layer devices exhibit advantages and disadvantages. A main problem is the operating voltage of such systems, which is still relatively high, inadequate efficiency and an inadequate lifetime.

Solution-processable polymers for OLEDs have attracted interest for some time, in particular for a new generation of flat screens or as lighting element. Although constant improvements in polymer OLEDs have been achieved in recent years, they still exhibit deficits with respect to their efficiency and lifetime compared with vapour-deposited OLED devices, which usually consist of a multiplicity of specific functional layers. By contrast, the advantage of polymer OLEDs lies in simple processing from solution, where various layers can easily be produced by known coating methods (printing, spin coating). By contrast, low-molecular-weight compounds (so-called "small molecules") have to be applied by vapour deposition in a vacuum chamber in a complex process.

In particular, polymer layers comprising conjugated polymers, which have very good electron-transport properties along the polymer backbone, have proven particularly advantageous. They enable both single-layer and two-layer OLED devices to be produced. The prior art also describes combinations between conjugated polymers and units of low-molecular-weight compounds, for example triarylamines, as hole transporters in conjugated polymers. However, these are frequently problematic since they interrupt the conjugation or require charge-transfer complexes.

The object of the present invention was therefore the provision of compounds which do not have the above-mentioned disadvantages on use in organic electronic devices, enable a lower operating voltage, but at the same time have adequate stability and efficiency, irrespective of use as copolymer or polymer blend.

Surprisingly, it has been found that polymers which contain structural units of the following formula (I) or polymer blends comprising polymers which contain structural units of the following formula (I) result in a reduction in the operating voltage. This has been demonstrated both in the case of polymers and also in the case of polymer blends which comprise the polymers according to the invention. In addition, it has also been possible to increase the efficiency and lifetime of these systems.

The present invention thus relates to a polymer containing at least one structural unit of the general formula (I)

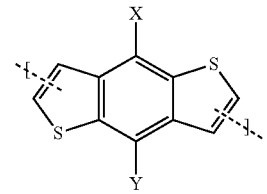

formula (I)

where the following applies to the symbols used:

X and Y are selected on each occurrence, in each case independently of one another, from an aryl or heteroaryl group or an aromatic or heteroaromatic ring system, where one or more H atoms may be replaced by R, where, in addition, one of the two groups X or Y may also be R, R is selected, in each case independently of one another, from D, F, Cl, Br, I, $N(Ar^1)_2$, $C(\!=\!O)Ar^1$, $P(\!=\!O)Ar^1{}_2$, $S(\!=\!O)Ar^1$, $S(\!=\!O)_2Ar^1$, $CR^1\!=\!CR^1Ar^1$, CN, $NO_2$, $Si(R^1)_3$, $B(OR^1)_2$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^1$, where one or more non-adjacent $CH_2$ groups may be replaced by $R^1C=CR^1$, $C≡C$, $Si(R^1)_2$, $Ge(R^1)_2$, $Sn(R^1)_2$, $C=O$, $C=S$, $C=Se$, $C=NR^1$, $P(=O)(R^1)$, SO, $SO_2$, $NR^1$, O, S or $CONR^1$ and where one or more H atoms may be replaced by F, Cl, Br, I, CN or $NO_2$, $Ar^1$ is selected on each occurrence, in each case independently of one another, from an aryl or heteroaryl group or an aromatic or heteroaromatic ring system, $R^1$ is, in each case independently of one another, H, an aliphatic hydrocarbon radical having 1 to 20 C atoms or an aromatic hydrocarbon radical having 6 to 20 C atoms, where the H atom present in each case in one or both of the thiophene rings may be replaced by R, and where the dashed lines, represent the bonds to the adjacent structural units in the polymer.

The aromatic ring system in the sense of the present preferably contains 6 to 60 C atoms in the ring system. The heteroaromatic ring system in the sense of the present invention contains 2 to 60 C atoms and at least one heteroatom in the ring system, with the proviso that the sum of C atoms and heteroatoms is at least 5. The heteroatoms are preferably selected from Si, N, P, O, S and/or Se, particularly preferably selected from N, P, O and/or S. An aromatic or heteroaromatic ring system in the sense of the present invention is, in addition, intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, a C ($sp^3$-hybridised), N or O atom. Thus, for example, systems such as 9,9'-spirobifluorene, 9,9-diarylfluorene, triarylamine, diaryl ethers, stilbene, etc., are also intended to be taken to be aromatic ring systems in the sense of the present invention, as are systems in which two or more aryl groups are interrupted, for example, by a linear or cyclic alkyl group or by a silyl group. P=O or C=O groups are usually not conjugation-interrupting.

An aromatic or heteroaromatic ring system having 5 to 60 ring atoms, which may also in each case be substituted by any desired radicals R and which may be linked to the aromatic or heteroaromatic ring system via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene.

An aryl group in the sense of the present invention contains 6 to 60 C atoms; a heteroaryl group in the sense of the present invention contains 2 to 60 C atoms and at least one heteroatom, with the proviso that the sum of C atoms and heteroatoms is at least 5. The heteroatoms are preferably selected from Si, N, P, O, S and/or Se, particularly preferably selected from N, P, O or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole, etc.

In the present invention, the term "aliphatic hydrocarbon radical having 1 to 20 carbon atoms" is taken to mean a saturated or unsaturated, non-aromatic hydrocarbon radical, which may be linear, branched or cyclic. One or more carbon atoms may be replaced by O, N or S. In addition, one or more hydrogen atoms may be replaced by fluorine. Examples of such compounds include the following: methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, octynyl, methoxy, trifluoromethoxy, ethoxy, n-propoxy, i-propoxy, n-butoxy, i-butoxy, s-butoxy, t-butoxy and 2-methylbutoxy, where methyl, ethyl, i-propyl and i-butyl are particularly preferred.

Preferred structural units of the formula (I) are structural units (Ia) to (Id) depicted below:

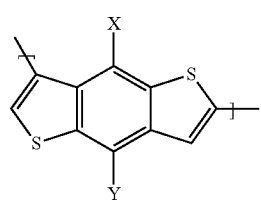

formula (Ia)

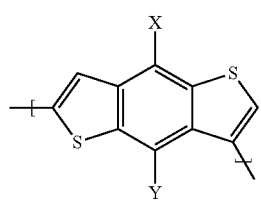

formula (Ib)

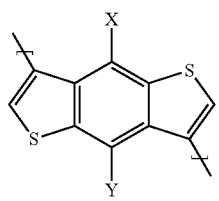

formula (Ic)

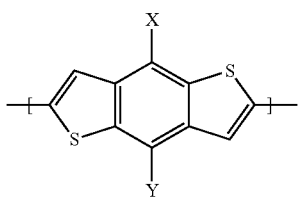

formula (Id)

where the structural units of the formulae (Ic) and (Id) are particularly preferred. Very particular preference is given to the structural unit of the formula (Id).

X and Y are preferably selected on each occurrence, in each case independently of one another, from an aryl or heteroaryl group or an aromatic or heteroaromatic ring system, where one or more H atoms may be replaced by R.

X and Y are particularly preferably selected on each occurrence, in each case independently of one another, from phenyl, naphthyl, anthracenyl, phenanthrenyl, pyrenyl, chrysenyl, perylenyl, fluoranthenyl, naphthacenyl, pentacenyl, benzopyrenyl, biphenyl, biphenylenyl, terphenyl, terphenylenyl, fluorenyl, spirobifluorenyl, dihydrophenanthrenyl, dihydropyrenyl, tetrahydropyrenyl, cis- or trans-indenofluorenyl, truxenyl, isotruxenyl, spirotruxenyl, spiroisotruxenyl, furanyl, benzofuranyl, isobenzofuranyl, dibenzofuranyl, thiophenyl, benzothiophenyl, isobenzothiophenyl, dibenzothiophenyl, pyrrolyl, indolyl, isoindolyl, carbazolyl, pyridinyl, quinolinyl, isoquinolinyl, acridinyl, phenanthridinyl, benzo-5,6-quinolinyl, benzo-6,7-quinolinyl, benzo-7,8-quinolinyl, phenothiazinyl, phenoxazinyl, pyrazolyl, indazolyl, imidazolyl, benzimidazolyl, naphthimidazolyl, phenanthrimidazolyl, pyridimidazolyl, pyrazinimidazolyl, quinoxalinimidazolyl, oxazolyl, benzoxazolyl, naphthoxazolyl, anthroxazolyl, phenanthroxazolyl, isoxazolyl, 1,2-thiazolyl, 1,3-thiazolyl, benzothiazolyl, pyridazinyl, benzopyridazinyl, pyrimidinyl, benzopyrimidinyl, quinoxalinyl, 1,5-diazaanthracenyl, 2,7-diazapyrenyl, 2,3-diazapyrenyl, 1,6-diazapyrenyl, 1,8-diazapyrenyl, 4,5-diazapyrenyl, 4,5,9,10-tetraazaperylenyl, pyrazinyl, phenazinyl, phenoxazinyl, phenothiazinyl, fluorubinyl, naphthyridinyl, azacarbazolyl, benzocarbolinyl, phenanthrolinyl, 1,2,3-triazolyl, 1,2,4-triazolyl, benzotriazolyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, 1,3,5-triazinyl, 1,2,4-triazinyl, 1,2,3-triazinyl, tetrazolyl, 1,2,4,5-tetrazinyl, 1,2,3,4-tetrazinyl, 1,2,3,5-tetrazinyl, purinyl, pteridinyl, indolizinyl, benzothiadiazolyl, benzanthrenyl, benzanthracenyl, rubicenyl and triphenylenyl. X and Y are very particularly preferably selected on each occurrence, in each case independently of one another, from phenyl, naphthyl, anthracenyl, phenanthrenyl, dihydrophenanthrenyl, biphenyl, terphenyl, fluorenyl, spirobifluorenyl, cis- or trans-indenofluorenyl, carbazolyl, pyridinyl, quinolinyl and isoquinolinyl.

Furthermore, X and/or Y may be substituted by one or more linear alkyl or alkoxy radicals having 1 to 12 C atoms, branched alkyl or alkoxy radicals having 3 to 12 C atoms or cyclic alkyl or alkoxy radicals having 6 to 12 C atoms, or by one or more aryl, heteroaryl, aryloxy or heteroaryloxy groups.

Particularly preferred structural units of the formula (Id) are structural units (Id1) to (Id20) depicted below:

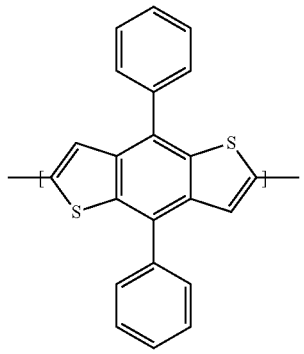

formula (Id1)

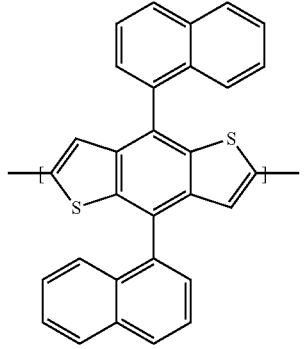

formula (Id2)

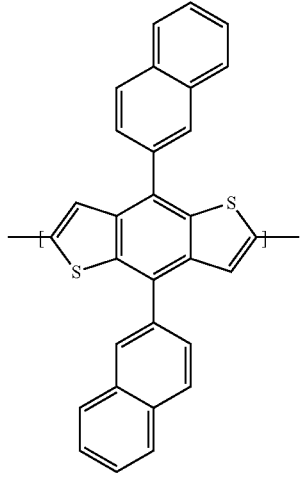

formula (Id3)

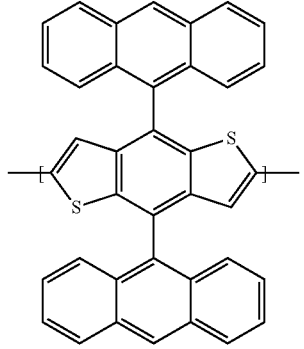

formula (Id4)

formula (Id5)
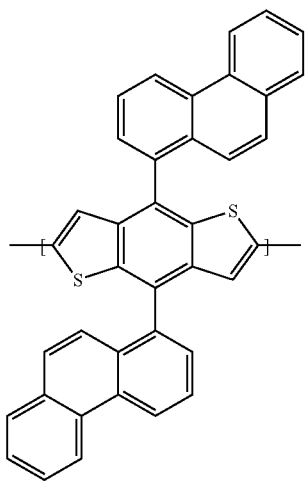
formula (Id6)
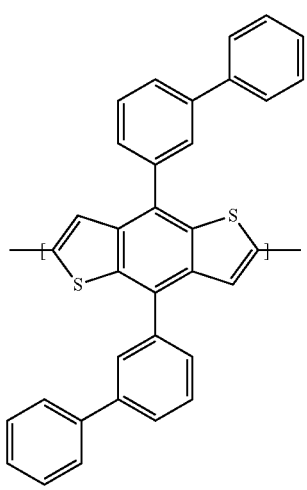
formula (Id7)
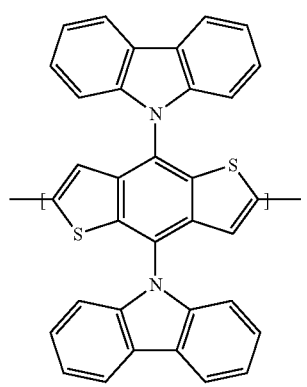
formula (Id8)
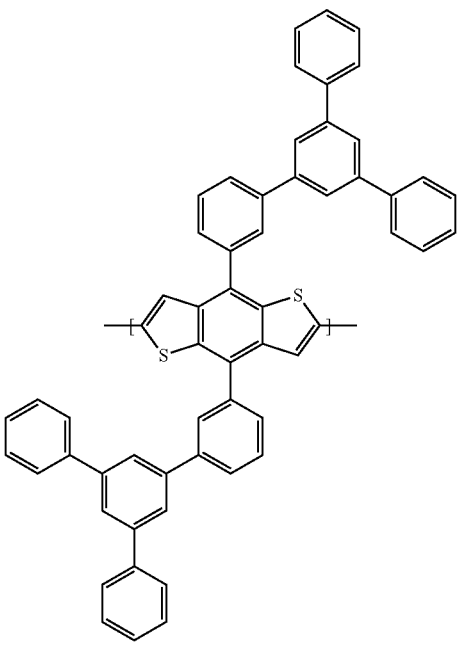
formula (Id9)
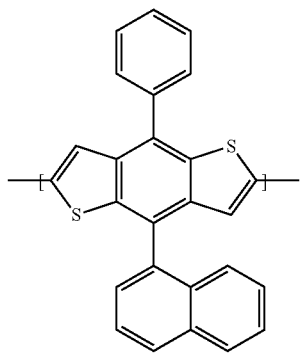
formula (Id10)
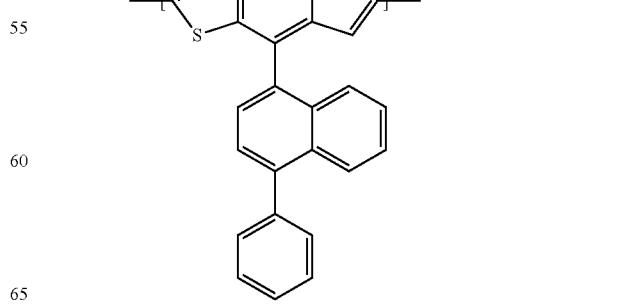

formula (Id11)
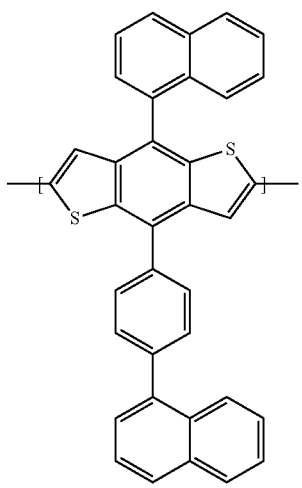
formula (Id12)
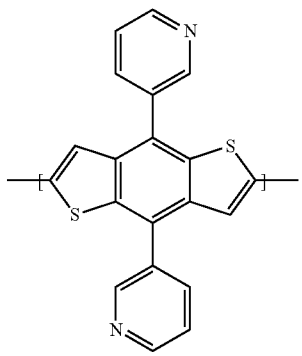
formula (Id13)
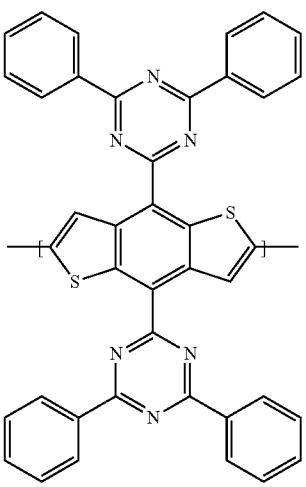
formula (Id14)
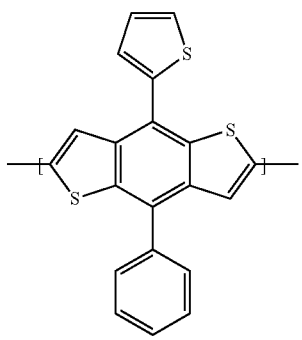
formula (Id15)
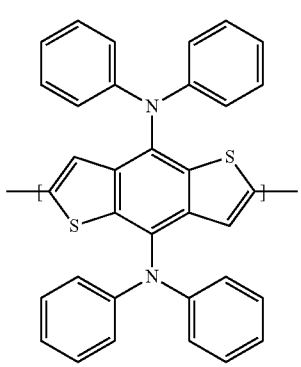
formula (Id16)
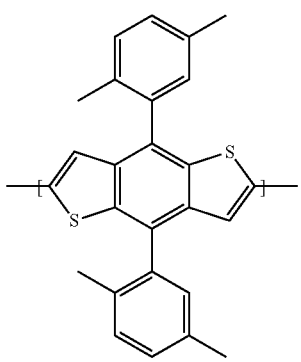
formula (Id17)
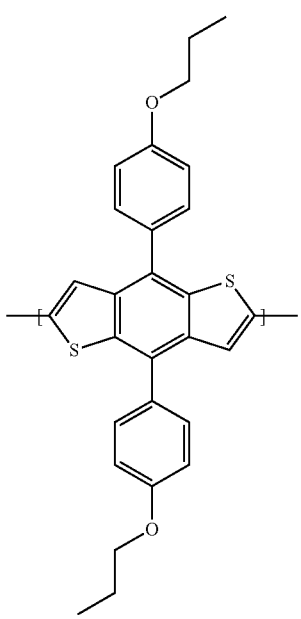

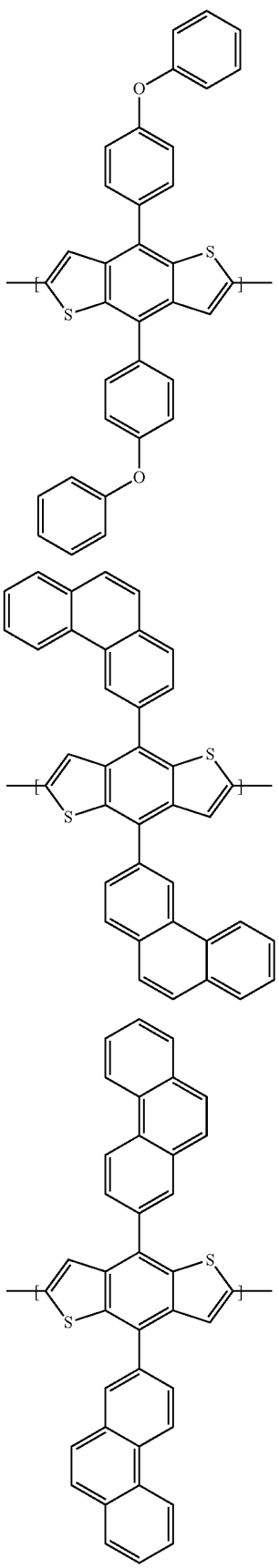

formula (Id18)

formula (Id19)

formula (Id20)

Preference is furthermore given to a polymer which contains at least one further structural unit which is different from the structural unit of the formula (I). The further structural unit here is preferably selected from a hole-injection, hole-transport, hole-blocking, electron-injection, electron-transport, electron-blocking, emitter, exciton-generating unit, a backbone unit or combinations thereof.

A polymer in the sense of the present invention is also intended to be taken to mean an oligomer and a dendrimer.

For the purposes of the present invention, the term oligomer is applied to a compound which has three to nine recurring units. A polymer in the sense of the present invention is taken to mean a compound which has ten or more recurring units. The branching factor of the polymers here is between 0 (linear polymer, no branching points) and 1 (fully branched dendrimer).

The oligomers, polymers or dendrimers may be conjugated, partially conjugated or non-conjugated, preference being given to conjugated oligomers, polymers or dendrimers. The oligomers or polymers may be linear, branched or dendritic. In the structures linked in a linear manner, the structural units of the formula (I) can either be linked directly to one another or they can be linked to one another via a divalent group, for example via a substituted or unsubstituted alkylene group, via a heteroatom or via a divalent aromatic or heteroaromatic group. In branched structures, for example, three or more structural units of the formula (I) can be linked via a trivalent or polyvalent group, for example via a trivalent or polyvalent aromatic or heteroaromatic group, to form a branched oligomer or polymer.

The proportion of the structural unit of the formula (I) in the polymer can be in the range from 0.05 to 100 mol %, preferably in the range from 0.2 to 80 mol % and particularly preferably in the range from 0.5 to 60 mol %.

The molecular weight $M_w$ of the polymer according to the invention is preferably in the range from 10,000 to 2,000,000 g/mol, particularly preferably in the range from 100,000 to 1,500,000 g/mol, and in particular in the range from 200,000 to 1,000,000 g/mol. The molecular weight $M_w$ is determined via GPC (=gel permeation chromatography) against an internal polystyrene standard.

Besides one or more structural units of the formula (I), the polymers according to the invention may also contain further structural units which are different from the above-mentioned structural units of the formula (I). These are, inter alia, those as disclosed and listed extensively in WO 02/077060 A1 and in WO 2005/014689 A2. These are incorporated into the present invention by way of reference. The further structural units can originate, for example, from the following classes:

Group 1: units which influence the hole-injection and/or hole-transport properties of the polymers;

Group 2: units which influence the electron-injection and/or electron-transport properties of the polymers;

Group 3: units which have combinations of individual units from group 1 and group 2;

Group 4: units which modify the emission characteristics to such an extent that electrophosphorescence can be obtained instead of electrofluorescence;

Group 5: units which improve transfer from the so-called singlet state to the triplet state;

Group 6: units which influence the emission colour of the resultant polymers;

Group 7: units which are typically used as backbone;

Group 8: units which influence the film-morphological and/or rheological properties of the resultant polymers.

Preferred polymers according to the invention are those in which at least one structural unit has charge-transport properties, i.e. which contain units from group 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −1.5 eV (against vacuum level), particularly preferably less than −2.0 eV.

It may be preferred for the polymers according to the invention to contain units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units from group 5 are those which improve transfer from the singlet state to the triplet state and which, employed in support of the structural elements from group 4, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bi-1,1'-naphthylylene, 4,4'-tolanylene, 4,4'-stilbenzylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film-morphological and/or rheological properties of the polymers, such as, for example, siloxanes, long alkyl chains or fluorinated groups, but also particularly rigid or flexible units, such as, for example, liquid crystal-forming units or crosslinkable groups.

Preference is given to polymers according to the invention which, besides structural units of the formula (I), at the same time additionally contain one or more units selected from groups 1 to 8 which are different from the structural units according to the invention. It may likewise be preferred for more than one structural unit from one group to be present at the same time.

Preference is given here to polymers according to the invention which, besides at least one structural unit of the formula (I), also contain units from group 7, particularly preferably at least 50 mol % of these units, based on the total number of structural units in the polymer.

It is likewise preferred for the polymers according to the invention to contain units which improve the charge transport and/or charge injection, i.e. units from group 1 and/or 2; a proportion of 0.5 to 30 mol % of these units is particularly preferred; a proportion of 1 to 10 mol % of these units is very particularly preferred.

It is furthermore particularly preferred for the polymers according to the invention to contain structural units from group 7 and units from groups 1 and/or 2, in particular at least 50 mol % of units from group 7 and 0.5 to 30 mol % of units from group 1 and/or 2.

The polymers according to the invention are either homopolymers containing structural units of the formula (I) or copolymers. The term copolymer in the present invention is also intended to be taken to mean terpolymers and multipolymers. The polymers according to the invention may be linear, branched or crosslinked. Besides one or more structural units of the formula (I) and preferred sub-formulae thereof, copolymers according to the invention may potentially have one or more further structures from groups 1 to 8 given above.

For the synthesis of the polymers according to the invention, the corresponding monomers are required. Monomers which result in structural units of the formula (I) in the polymers according to the invention are compounds which are correspondingly substituted and have in two positions suitable functionalities which allow this monomer unit to be incorporated into the polymer. These monomers are novel and are therefore likewise a subject-matter of the present invention.

Accordingly, the present invention also relates to compounds of the following formula (II),

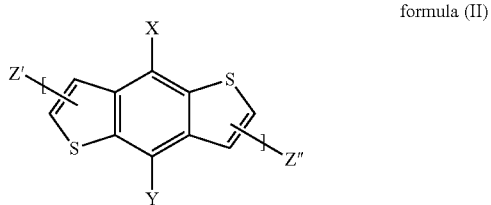

formula (II)

where the symbols used have the following meanings:

Z' and Z" are selected, independently of one another, from the group consisting of halogen, O-tosylate, O-triflate, O—SO$_2$R$^2$, B(OR$^2$)$_2$ and Sn(R$^2$)$_3$, where R$^2$ is selected on each occurrence, independently of one another, from the group consisting of H, an aliphatic hydrocarbon radical having 1 to 20 C atoms and an aromatic hydrocarbon radical having 6 to 20 ring atoms, and where two or more radicals R$^{32}$ may also form an aliphatic ring system with one another, and where the other symbols have the same meaning as in the above embodiments. The preferred embodiments of the structural unit of the formula (I) are also preferred embodiments here.

In the present invention, halogen is taken to mean fluorine, chlorine, bromine or iodine, where chlorine, bromine and iodine are preferred, and bromine and iodine are particularly preferred.

In a preferred embodiment of the present invention, Z' and Z" in the compounds of the formula (II) are selected, independently of one another, from Br, I and B(OR$^2$)$_2$.

In the present invention, the term "aliphatic hydrocarbon radical having 1 to 20 carbon atoms" is taken to mean a saturated or unsaturated, non-aromatic hydrocarbon radical, which may be linear, branched or cyclic. One or more carbon atoms may have been replaced by O, N or S. In addition, one or more hydrogen atoms may have been replaced by fluorine. Examples of such compounds include the following: methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl, where methyl, ethyl, i-propyl and i-butyl are particularly preferred.

In the present invention, the term "aromatic hydrocarbon radical having 5 to 20 ring atoms" is taken to mean an aromatic ring system having 6 to 20 carbon atoms or a heteroaromatic ring system having 5 to 20 ring atoms, where one or more of the ring atoms are intended to be a heteroatom selected from N, O and S and the others are carbon atoms. For the purposes of the present invention, these definitions are also intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, C (sp$^3$-hybridised), N, O, Si, P, S, Ge (e.g.: CR$_2$, C=O, NR, O, SiR$_2$, P=O, S and GeR$_2$, where R is selected from the group consisting of H, a C$_{1-40}$-alkyl group, a C$_{2-40}$-alkenyl group, a C$_{2-40}$-alkynyl group, an optionally substituted C$_{6-40}$-aryl group and an optionally substituted 5- to 25-membered heteroaryl group). In addition, they may also be mono- or polycyclic, i.e. they may have one ring (for example phenyl) or two or more rings, which may also be condensed (for example naphthyl) or covalently linked (for example biphenyl), or contain a combination of condensed and linked rings. Fully conjugated aryl groups are preferred.

The polymers according to the invention are generally prepared by polymerisation of one or more types of monomer, of which at least one type of monomer results in structural units of the formula (I) in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The methods for the C—C linking reactions are preferably selected from the group comprising SUZUKI coupling, the YAMAMOTO coupling and the STILLE coupling, and the method for the C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The present invention furthermore relates to blends comprising a polymer containing one or more structural units of the formula (I) and at least one further, different polymer, oligomer, dendrimer or a low-molecular-weight compound.

In a preferred embodiment of the present invention, the blend comprises a polymer containing structural units of the formula (I) and a polymeric compound containing one or more emitter units. In a further preferred embodiment, the blend comprises a polymer containing structural units of the formula (I), a polymer containing one or more emitter units and a third component which introduces an additional functionality. This may in turn be a polymer, but may also be a low-molecular-weight compound (so-called "small molecule").

The blend may additionally also comprise further polymeric compounds. In the extreme case, the requisite functionalities may be distributed over the same number of polymers. In this case, a blend can be built up as follows in accordance with the invention:

polymer containing structural units of the formula (I) according to the invention and
polymer containing hole-injection units and/or
polymer containing hole-transport units and/or
polymer containing hole-blocking units and/or
polymer containing emitter units and/or
polymer containing electron-injection units and/or
polymer containing electron-transport units and/or
polymer containing electron-blocking units and/or
polymer containing exciton-generating units.

Preference is thus also given in accordance with the invention to a blend comprising further polymers, each of which contain, independently of one another, a hole-injection, hole-transport, hole-blocking, electron-injection, electron-transport, electron-blocking, emitter or exciton-generating unit. The polymer according to the invention or the blend according to the invention can be used in an organic electronic device, in which the polymer or blend is preferably within an organic layer. The organic layer may furthermore comprise further constituents, for example low-molecular-weight compounds or compounds which improve the film-formation properties. For the production of the organic layer, a liquid formulation comprising the polymer or blend according to the invention and one or more solvents is usually used. The polymer layer can be produced, for example, by coating from solution, for example spin coating, ink-jetting or the like. The techniques necessary for this purpose are known to the person skilled in the art. After application of the polymer layer and removal of the solvent, the polymer can additionally be crosslinked. The crosslinking is preferably carried out with radiation induction (for example with UV light, visible light, microwaves, electron beams) or thermally. However, substituents which are suitable for crosslinking, for example vinyl groups, must be present.

The present invention thus also relates to a formulation comprising a polymer according to the invention or a blend according to the invention and one or more solvents. The way in which formulations of this type can be prepared is known to the person skilled in the art and is described, for example, in WO 02/072714, WO 03/019694 and the literature cited therein.

Suitable and preferred solvents are, for example, toluene, anisoles, xylenes, methyl benzoate, dimethyl anisoles, mesitylenes, tetralin, veratrols and tetrahydrofuran or mixtures thereof.

The polymers, blends (mixtures) and formulations according to the invention can be used in electronic or opto-electronic devices or for the production thereof.

The present invention thus furthermore relates to the use of the polymers, blends (mixtures) and formulations according to the invention in electronic or opto-electronic devices, preferably in organic or polymeric organic electroluminescent devices (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic or polymeric organic electroluminescent devices (OLEDs, PLEDs), in particular in polymeric organic electroluminescent devices (PLEDs).

The way in which OLEDs or PLEDs can be produced is known to the person skilled in the art and is described in detail, for example, as a general process in WO 2004/070772 A2, which should be adapted correspondingly for the individual case.

As described above, the polymers according to the invention are very particularly suitable as electroluminescent materials in PLEDs or displays produced in this way.

Electroluminescent materials in the sense of the present invention are taken to mean materials which can be used as active layer. Active layer means that the layer is capable of emitting light on application of an electric field (light-emitting layer) and/or that it improves the injection and/or transport of positive and/or negative charges (charge-injection or charge-transport layer).

The present invention therefore also preferably relates to the use of the polymers or blends (mixtures) according to the invention in a PLED, in particular as electroluminescent material.

The present invention furthermore relates to an organic electronic device comprising one or more organic layers, where at least one layer comprises a polymer according to the invention or a blend according to the invention.

In a further embodiment of the present invention, the device comprises a plurality of layers. These can be layers which comprise the polymer according to the invention or the blend according to the invention or layers which comprise polymers which are independent thereof, blends or low-molecular-weight compounds. The polymer according to the invention or the blend according to the invention can be present here in the form of a hole-transport, hole-injection, emitter, electron-transport, electron-injection, charge-blocking and/or charge-generation layer.

The organic electroluminescent device here may comprise one emitting layer or a plurality of emitting layers, where at least one emitting layer comprises or consists of at least one polymer according to the invention or blend according to the invention. If a plurality of emission layers are present, these preferably have in total a plurality of emission maxima between 380 nm and 750 nm, resulting overall in white emission, i.e. various emitting compounds which are able to fluoresce and/or phosphoresce are used in the emitting layers. Very particular preference is given to three-layer systems, where the three layers exhibit blue, green and orange or red emission (for the basic structure see, for example, WO 05/011013). White-emitting devices are suitable, for example, as lighting or backlighting of displays (LCDs).

Apart from these layers, it may also comprise further layers, for example in each case one or more hole-injection layers, hole-transport layers, hole-blocking layers, electron-transport layers, electron-injection layers, exciton-blocking layers and/or charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*). It is likewise possible for interlayers, which have, for example, an exciton-blocking function, to be introduced between two emitting layers. However, it should be pointed out that each of these layers does not necessarily have to be present. These layers may likewise comprise the polymers or blends according to the invention, as defined above. It is also possible for a plurality of OLEDs to be arranged one above the other, which enables a further increase in efficiency with respect to the light yield to be achieved. In order to improve the coupling-out of light, the final organic layer on the light exit side in OLEDs can also be designed as a nanofoam, which reduces the proportion of total reflection.

The device may furthermore comprise layers which are built up from small molecules (SMOLEDs). These can be produced by evaporation of low-molecular-weight compounds in a high vacuum.

Preference is thus furthermore given to an organic electroluminescent device in which one or more layers are coated by means of a sublimation process, in which the materials are vapour-deposited in vacuum sublimation units at a pressure of less than $10^{-5}$ mbar, preferably less than $10^{-6}$ mbar, particularly preferably less than $10^{-7}$ mbar.

Preference is likewise given to an organic electroluminescent device which is characterised in that one or more layers are coated by means of the OVPD (organic vapour phase deposition) process or with the aid of carrier-gas sublimation, where the materials are applied at a pressure of between $10^{-5}$ mbar and 1 bar.

Preference is furthermore given to an organic electroluminescent device in which one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds, which are obtained, if necessary, by suitable substitution, are necessary for this purpose.

The organic electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

The device usually comprises a cathode and an anode (electrodes). For the purposes of the present invention, the electrodes (cathode, anode) are selected in such a way that their potential matches as closely as possible the potential of the adjacent organic layer in order to ensure highly efficient electron or hole injection.

The cathode preferably comprises metal complexes, metals having a low work function, metal alloys or multilayered structures containing various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, $Li_2O$, $BaF_2$, MgO, NaF, etc.). The layer thickness of this layer is preferably between 1 and 10 nm, particularly preferably between 2 and 8 nm.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. For some applications, at least one of the electrodes must be transparent in order to facilitate either irradiation of the organic material (O-SCs) or the coupling-out of light (OLEDs/PLEDs, O-lasers). A preferred construction uses a transparent anode. Preferred anode materials here are conductive mixed metal oxides. Particular preference is given to indium tin oxide (ITO) or indium zinc oxide (IZO). Preference is furthermore given to conductive doped organic materials, in particular conductive doped polymers, such as, for example, PEDOT or PANI.

The device is correspondingly structured in a manner known per se, depending on the application, provided with contacts and finally hermetically sealed, since the lifetime of such devices is drastically shortened in the presence of water and/or air.

The present invention is explained in greater detail below with reference to some examples, which should not be taken to be restrictive of the scope of the invention.

WORKING EXAMPLES

A) Preparation of the Monomers

Examples 1 to 3

Example 1

Preparation of Compound 4 (M1)

Compound 4 is prepared as follows:

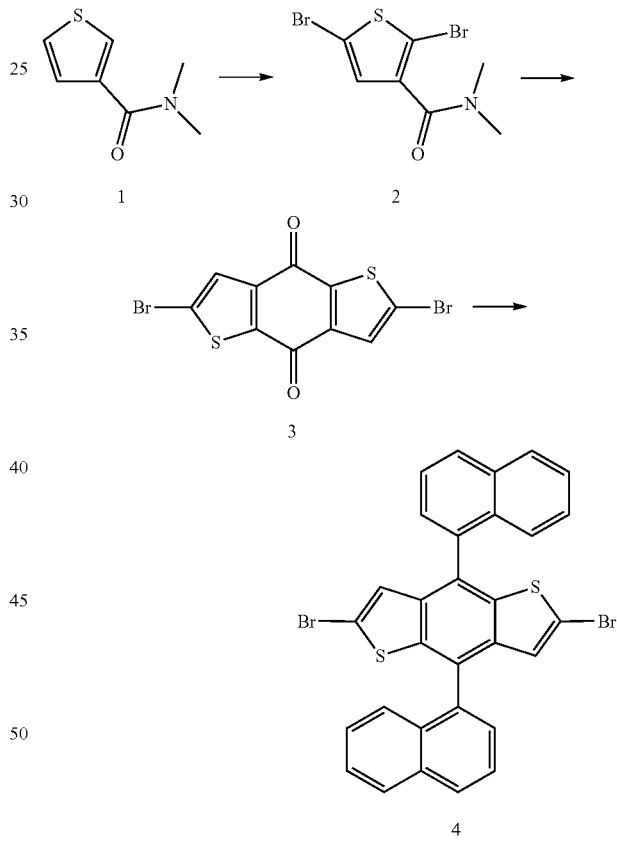

1.1 Compound 2

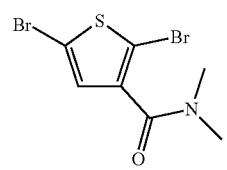

49.7 g (0.32 mol) of compound 1 are initially introduced in 1400 ml of dimethylformamide, and 154.0 g (0.86 mol) of N-bromosuccinimide (NBS) are added at room temperature. The reaction mixture is stirred at room temperature overnight. When the reaction is complete, 1500 ml of water are carefully added. The phases are separated, and the aqueous phase is extracted with ethyl acetate. The organic phases are combined, dried over sodium sulfate, and evaporated under reduced pressure. The yellow residue is employed in the subsequent reaction without further purification. The yield is 54.7 g (0.18 mol, 54%).

1.2 Compound 3

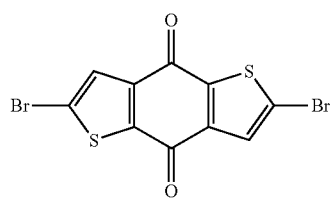

3

51.6 g (0.17 mol) of compound 2 are initially introduced in 500 ml of diethyl ether and cooled to −78° C. 72.5 ml (0.18 mol) of n-butyllithium, 2.5 M in hexane, are added dropwise, the mixture is subsequently stirred at −78° C. for 2 hours and at room temperature overnight. The reaction mixture is poured into 500 ml of a saturated NH₄Cl solution. The precipitated solid is filtered off with suction, washed with diethyl ether and employed in the subsequent reaction without further purification. The yield is 25.0 g (0.07 mol, 41%).

1.3 Compound 4

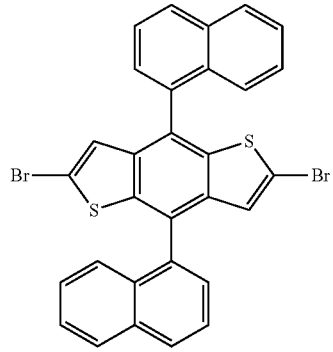

4

22.0 ml (0.15 mol) of 1-bromonaphthalene are initially introduced in 160 ml of THF and cooled to −78° C. 66.0 ml (0.16 mol) of n-butyllithium, 2.5 M in hexane, are added dropwise, the mixture is subsequently stirred at −78° C. for 2 hours. 19.1 g (0.05 mol) of compound 3 are then added in small portions. The reaction solution is stirred at −78° C. for a further hour and at room temperature overnight. 39.1 g (0.19 mol) of SnCl₂ are subsequently dissolved in 90 ml of 10% HCl and slowly added dropwise. The reaction mixture is warmed under reflux for 3 hours. When the reaction is complete, the reaction mixture is filtered and evaporated under reduced pressure. The residue is washed in acetone and recrystallised from toluene. The yield is 12.3 g (0.02 mol, 41%).

Example 2

Preparation of Compound 5 (M2)

Compound 5 is prepared as follows:

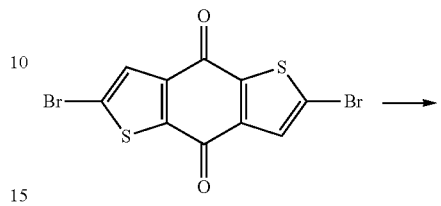

3

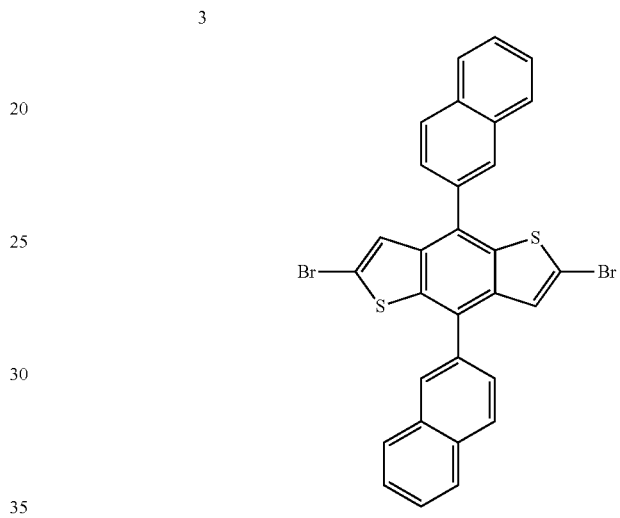

5

2.1 Compound 5

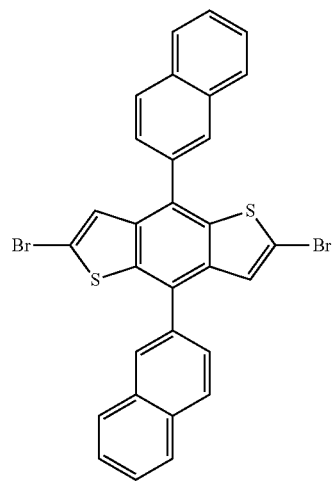

5

The synthesis is carried out analogously to Example 1 (compound 4) using 38.2 g (0.10 mol) of compound 3, with the 1-bromonaphthalene being replaced by 66.7 g (0.3 mol) of 2-bromonaphthalene. The yield is 22.4 g (0.04 mol), corresponding to 35.3% of theory.

Example 3

Preparation of Compound 6 (M3)

Compound 6 is prepared as follows:

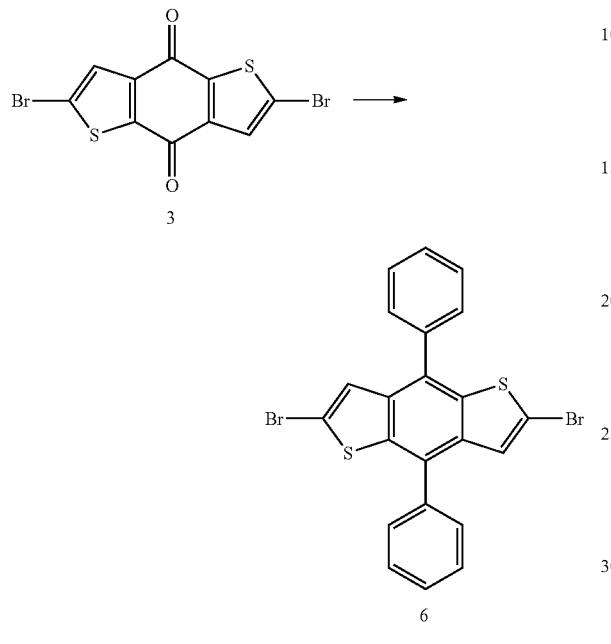

2.1 Compound 6

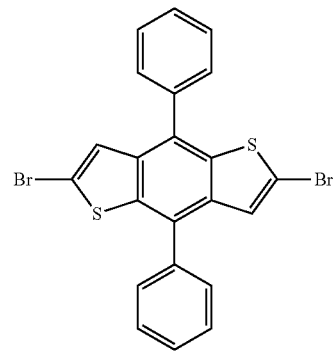

The synthesis is carried out analogously to Example 1 (compound 4) using 38.2 g (0.10 mol) of compound 3, with the 1-bromonaphthalene being replaced by 33.9 ml (0.3 mol) of bromobenzene. The yield is 24.2 g (0.05 mol), corresponding to 45.7% of theory.

B) Preparation of the Polymers

Examples 4 to 13

Polymers P1 to P7 according to the invention and comparative polymers C1 to C4 are synthesised by SUZUKI coupling in accordance with WO 03/048225 A2 using the following monomers (percent data=mol %).

Example 4

Polymer P1

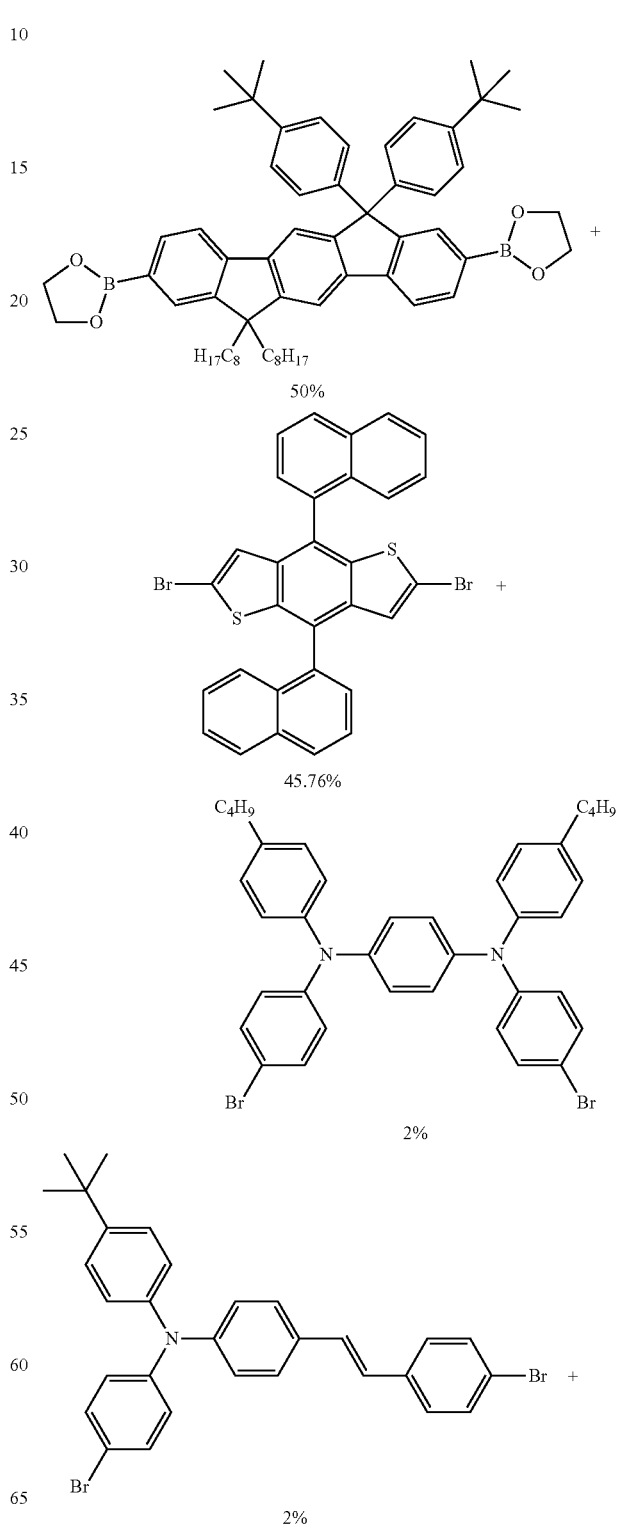

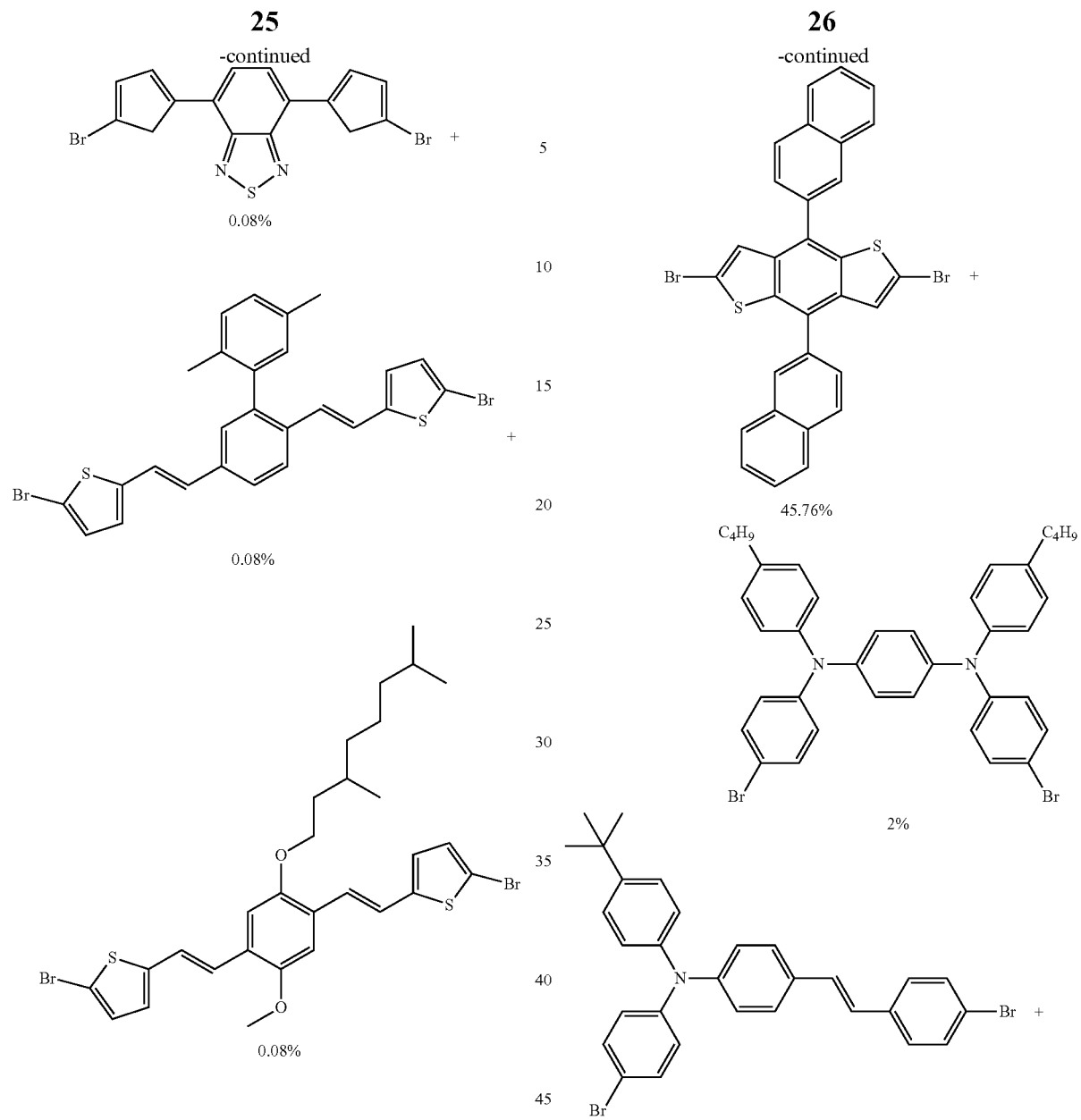
Example 5
Polymer P2
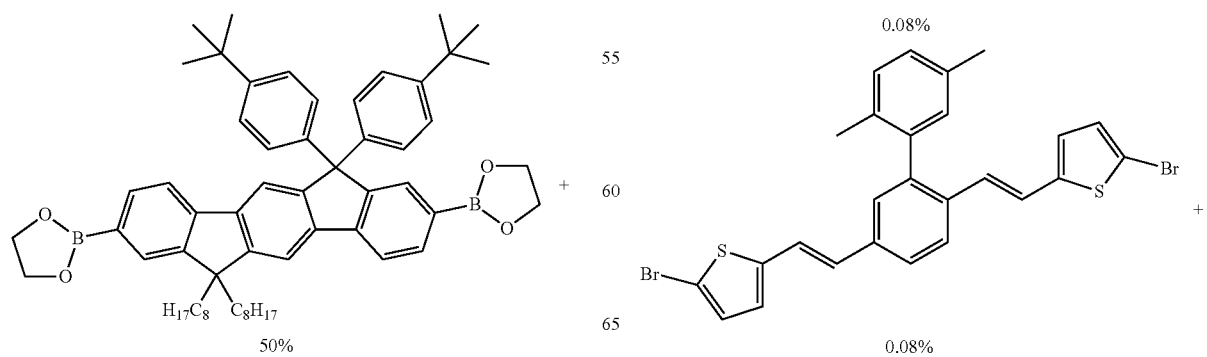

-continued
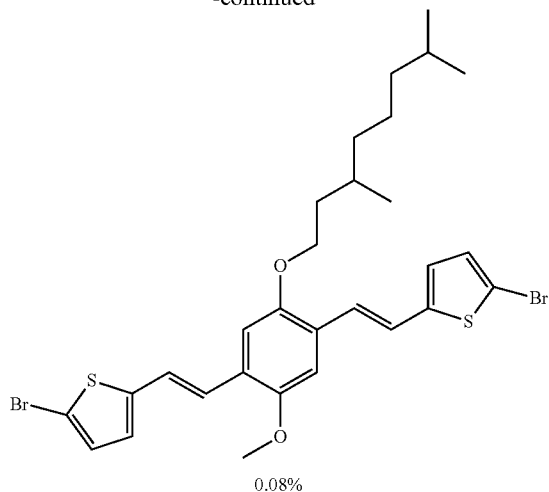
0.08%
Example 6
Polymer P3
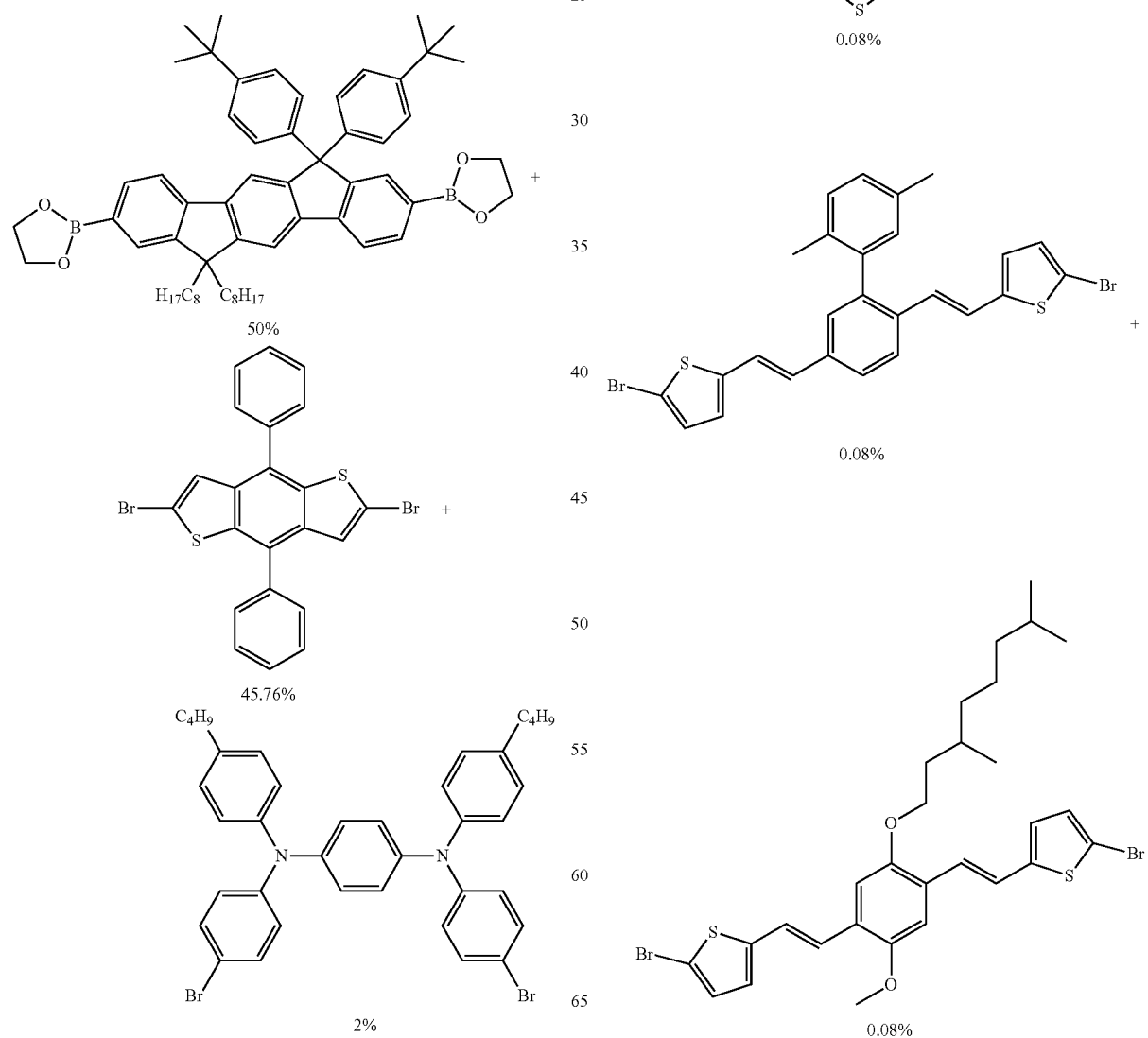
-continued
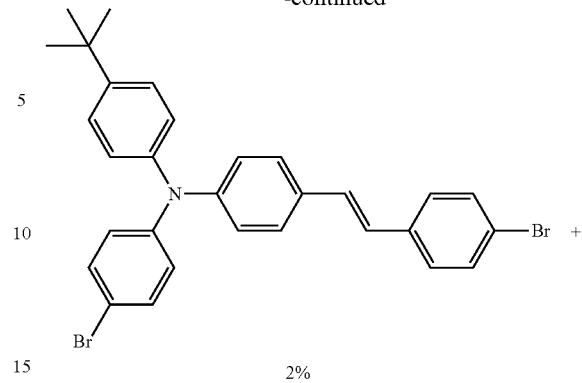
2%
0.08%
0.08%
0.08%

Example 7
Polymer C1
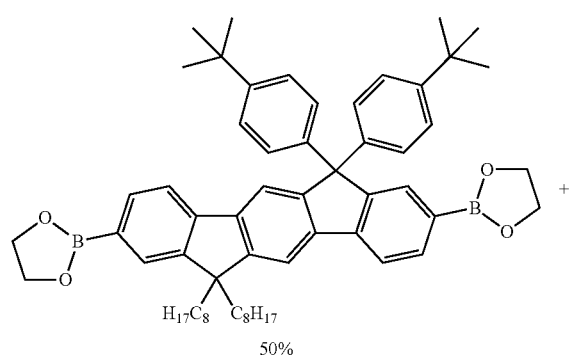
50%
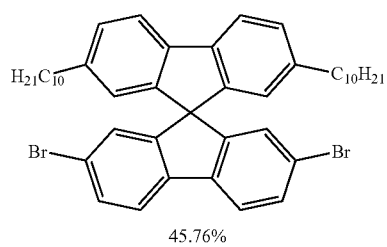
45.76%
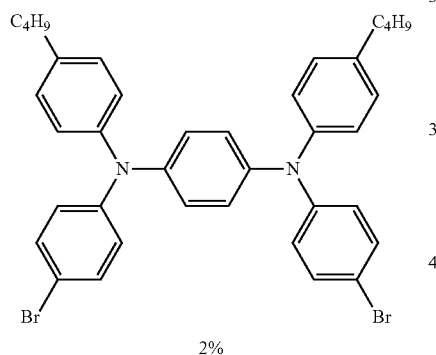
2%
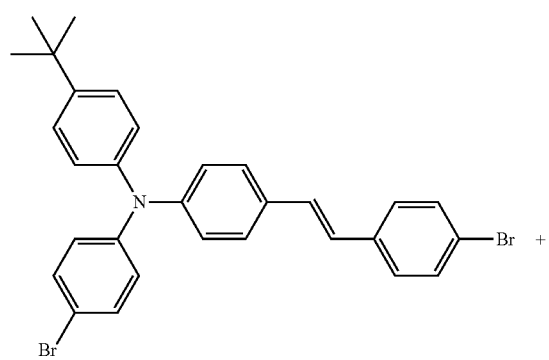
2%
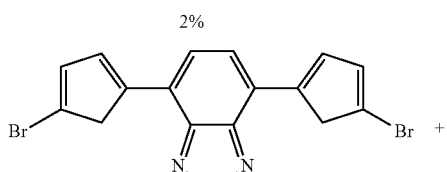
0.08%
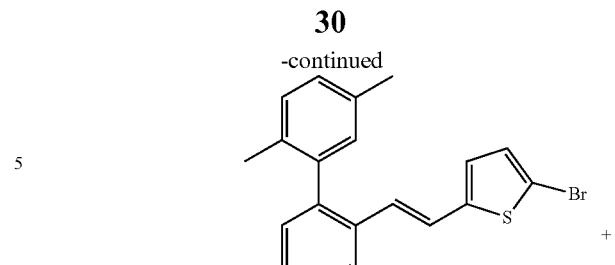
0.08%
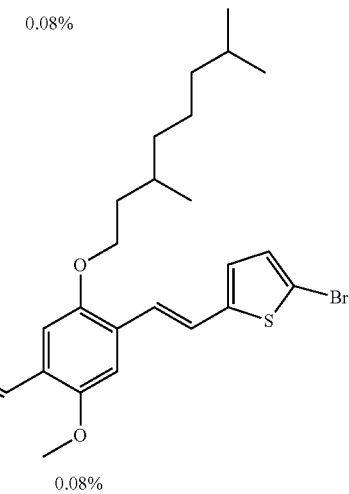
0.08%
Example 8
Polymer P4
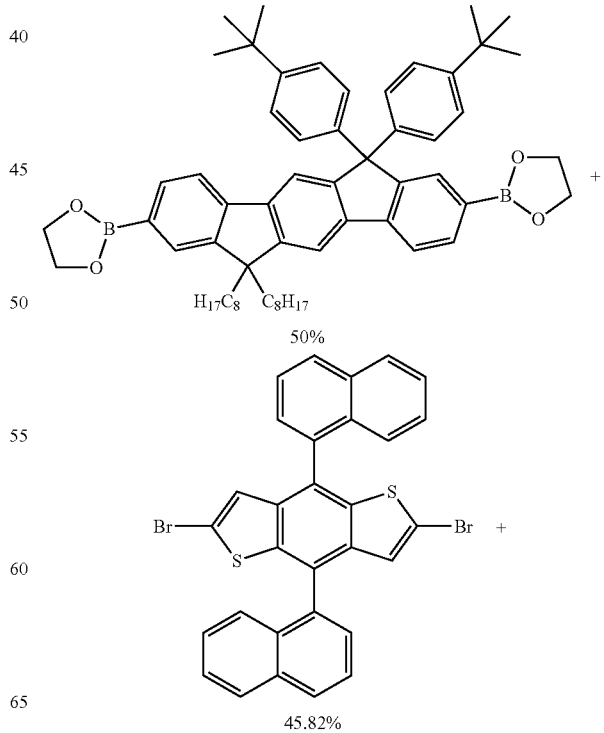
50%
45.82%

31
-continued
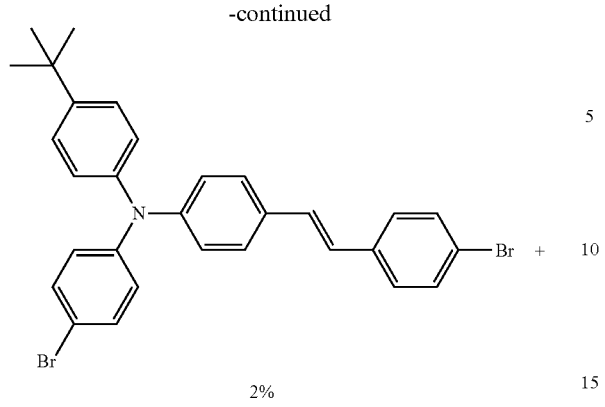
2%
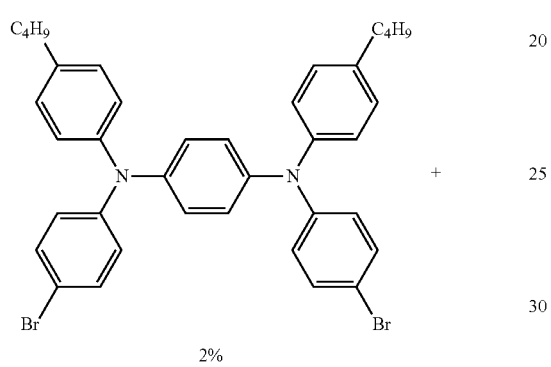
2%
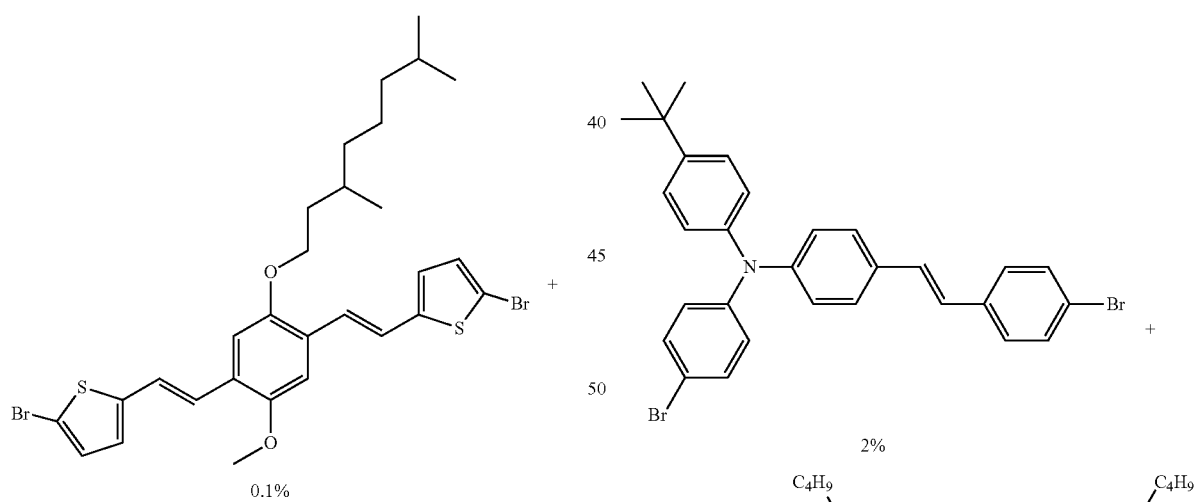
0.1%
0.08%
32
Example 9
Polymer C2
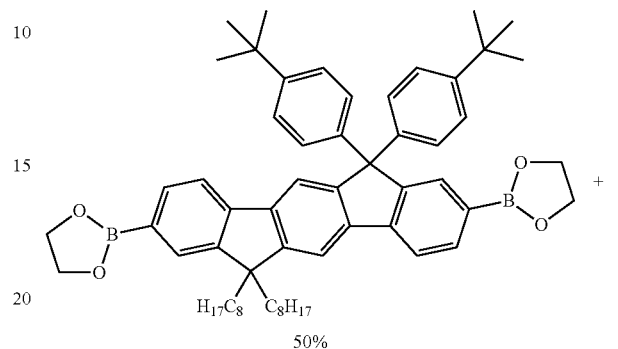
50%
45.82%
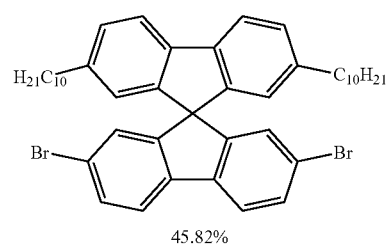
2%
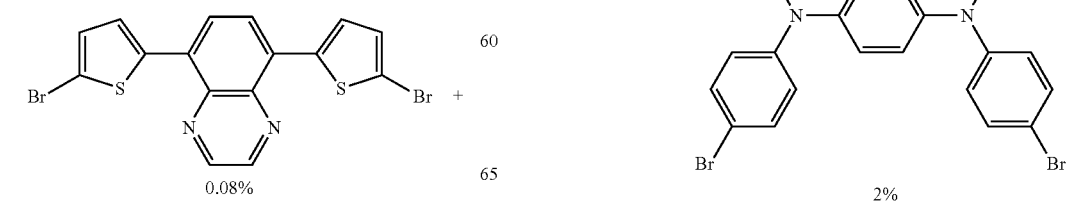
2%

-continued
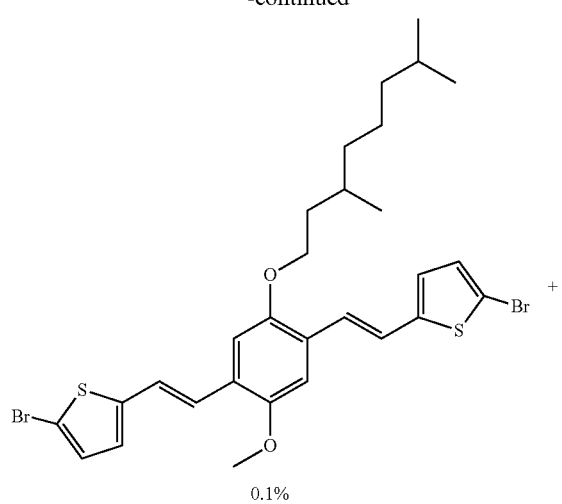
0.1%
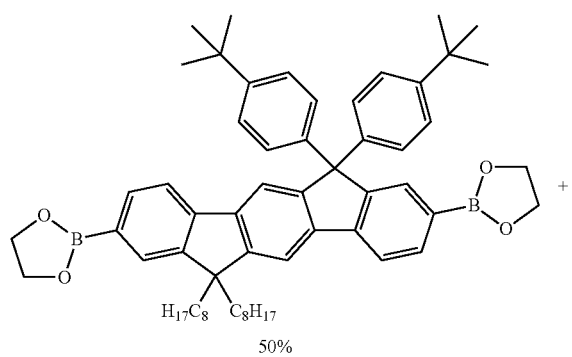
0.08%
Example 10
Polymer P5
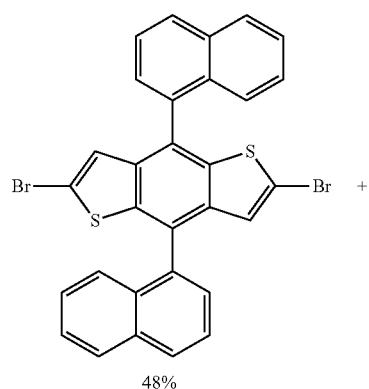
50%
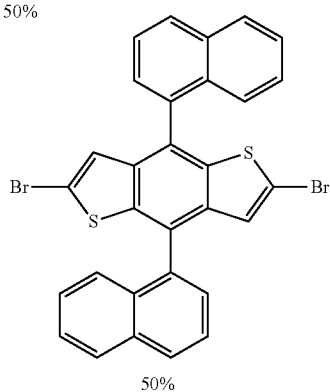
48%
-continued
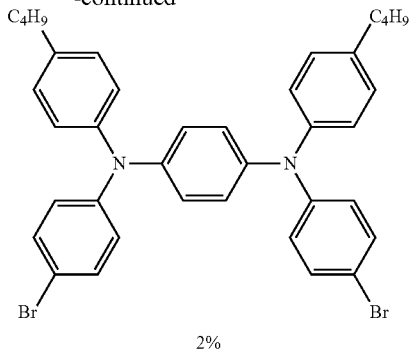
2%
Example 11
Polymer P6
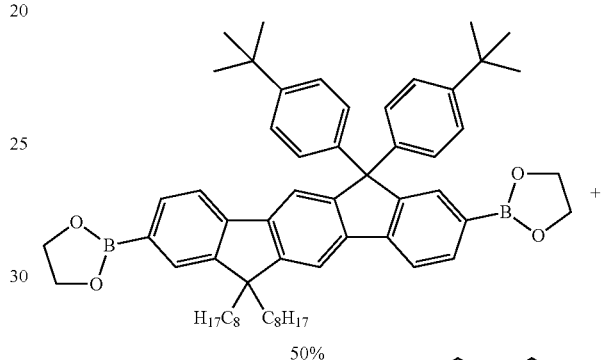
50%
50%
Example 12
Polymer P7
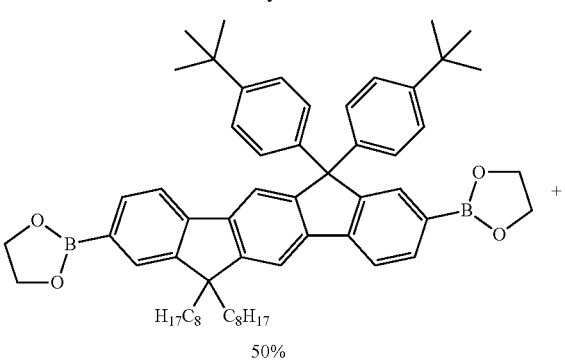
50%

36
Example 13
Polymer C3
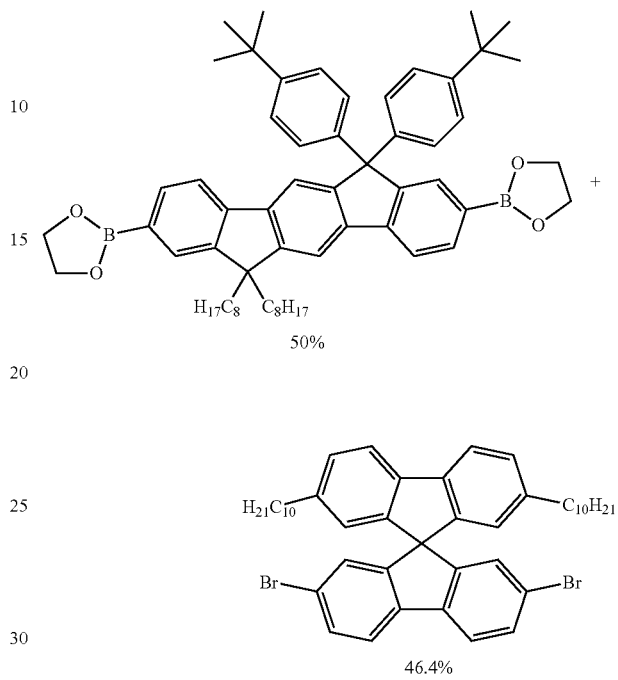
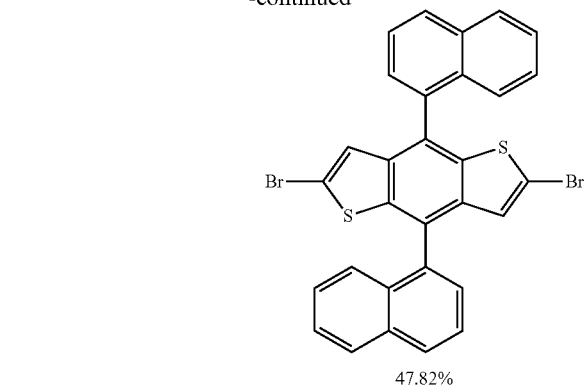
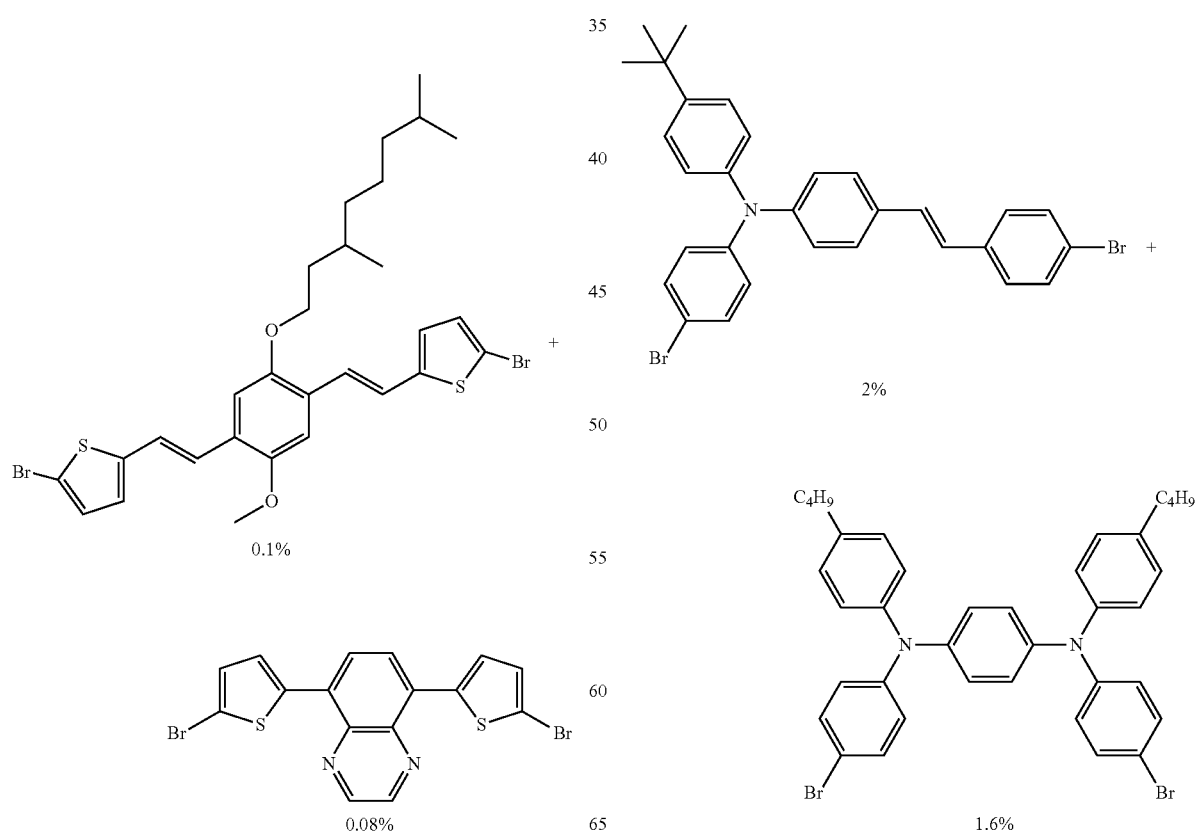

Example 14

Polymer C4

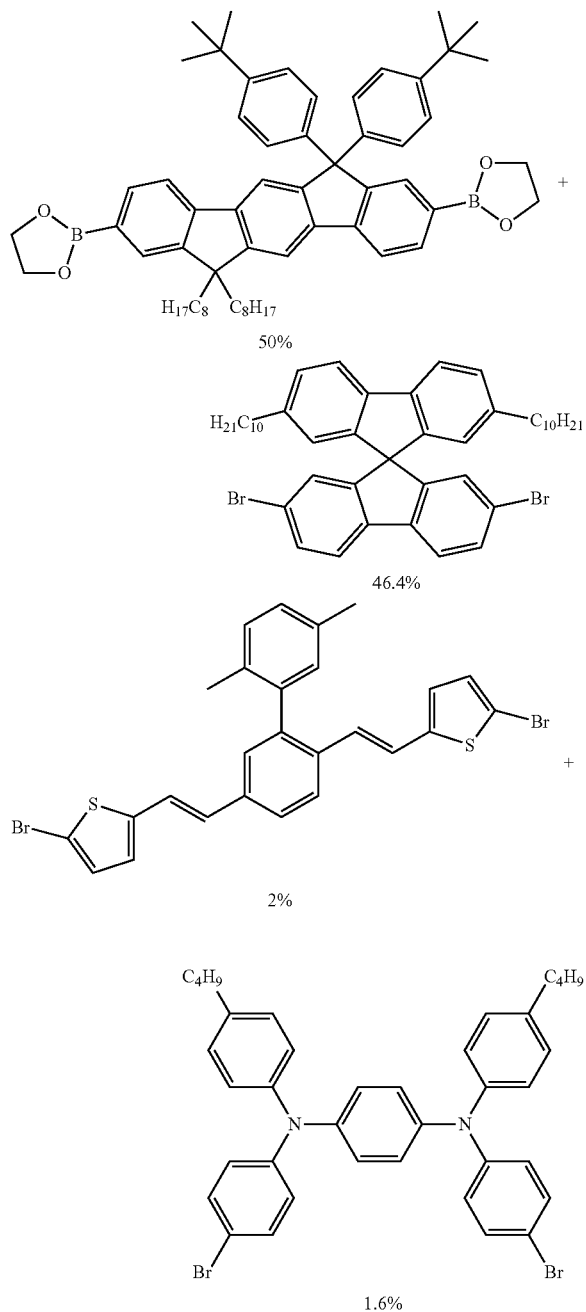

C) Production of PLEDs

Examples 15 to 21

The production of a polymeric organic light-emitting diode (PLED) has already been described a number of times in the literature (for example in WO 2004/037887 A2). In order to explain the present invention by way of example, PLEDs comprising polymers P1 to P7 and comprising comparative polymers C1 to C4 or comprising blends of these polymers are produced by spin coating. A typical device has the structure depicted in FIG. 1.

Figure 2:
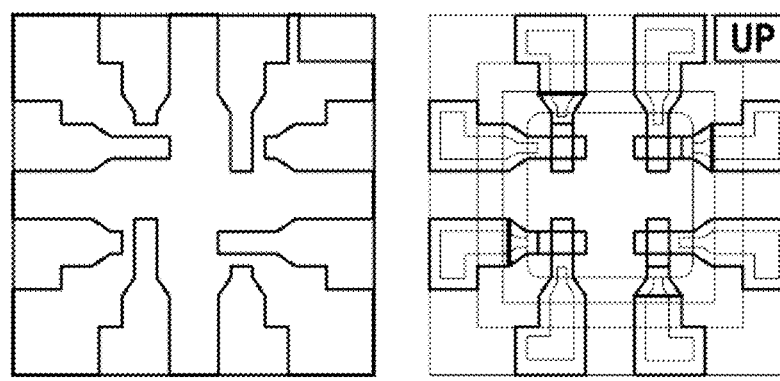

To this end, specially manufactured substrates from Technoprint are used in a layout designed specifically for this purpose (FIG. 2, left-hand figure: ITO structure applied to the glass support, right-hand figure: complete electronic structure with ITO, vapour-deposited cathode and optional metallisation of the leads). The ITO structure (indium tin oxide, a transparent, conductive anode) is applied to soda-lime glass by sputtering in a pattern such that 4 pixels measuring 2×2 mm are produced with the cathode applied by vapour deposition at the end of the production process.

The substrates are cleaned in a clean room with deionised water and a detergent (Deconex 15 PF) and then activated by a UV/ozone plasma treatment. An 80 nm layer of PEDOT (PEDOT is a polythiophene derivative (Baytron P VAI 4083sp.) from H.C. Starck, Goslar, which is supplied as an aqueous dispersion) is then applied by spin coating, likewise in a clean room. The spin rate necessary depends on the degree of dilution and the specific spin-coater geometry (typically for 80 nm: 4500 rpm). In order to remove residual water from the layer, the substrates are dried by heating on a hotplate at 180° C. for 10 minutes. After this, firstly 20 nm of an interlayer (typically a hole-dominated polymer, here HIL-012 from Merck) and then 65 nm of the polymer layers are applied from toluene solutions (concentration of interlayer 5 g/l, for polymers P1 to P7 and C1 to C4 between 8 and 10 g/l) under an inert-gas atmosphere (nitrogen or argon). The two layers are dried by heating at 180° C. for at least 10 minutes.

In a variation of this process, it is not individual polymers, but instead polymer blends that are used in the emission layer. To this end, blend solutions are prepared by the following general method: for each component, a solution having the same concentration is prepared. To this end, a corresponding amount of the solid compound is weighed out and added to the corresponding amount of a suitable solvent. The mixture is then stirred for at least 1 hour until a clear solution has formed. For the preparation of the blend, the corresponding volumes of the solution are taken using a pipette and combined in a fresh vessel. For example, for the preparation of 10 ml of blend comprising 50% of component A and 50% of component B, a volume of 5 ml of component A (8 g/l) and a volume of 5 ml of component B (8 g/l) are combined. The solvent used can be, for example, toluene, which is employed here in all examples. As an alternative to mixing solutions, a common solution of the polymers employed can also be prepared directly in the case of an adequate amount of solution (in order to guarantee weighing accuracy). Thus, blends having a composition of 37.5% of component A and 62.5% of component B are prepared by weighing out 3 g/l of component A and 5 g/l of component B.

After application of the polymer or polymer blend emission layer, the Ba/Al cathode is applied in the pattern indicated by vapour deposition through a vapour-deposition mask (high-purity metals from Aldrich, particularly barium 99.99% (order No. 474711); vapour-deposition units from Lesker or others, typical vacuum level $5\times10^{-6}$ mbar). Finally, the device is encapsulated in order to protect, in particular, the cathode against air and atmospheric moisture and is then characterised.

Figure 3:
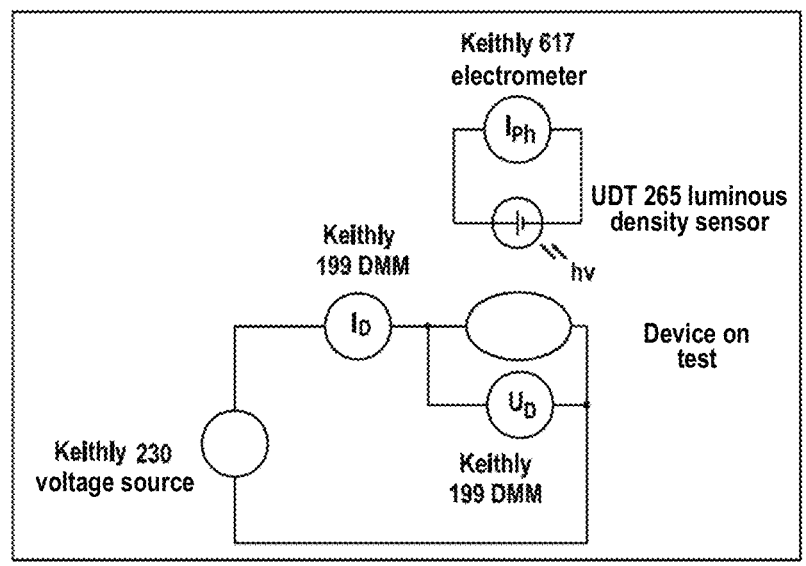

To this end, the devices are clamped into holders manufactured specifically for the substrate size and provided with spring contacts. A photodiode with eye response filter can be placed directly on the measurement holder in order to exclude influences from extraneous light. The typical measurement set-up is depicted in FIG. 3.

The voltages are typically increased from 0 to max. 20 V in 0.2 V steps and reduced again. For each measurement point, the current through the device and the photocurrent obtained are measured by the photodiode. In this way, the IUL data of the test devices are obtained. Important parameters are the maximum efficiency measured ("max. eff." in cd/A) and the voltage required for 100 cd/m².

In order, in addition, to determine the colour and the precise electroluminescence spectrum of the test devices, the voltage required for 100 mA/cm² is applied again after the first measurement, and the photodiode is replaced by a spectrum measurement head. This is connected to a spectrometer (Ocean Optics) by an optical fibre. The colour coordinates (CIE: Commission International de l'Eclairage, standard observer from 1931) can be derived from the measured spectrum.

Of particular importance for the usability of the materials is the lifetime of the devices. This is measured in a measurement set-up which is very similar to the first evaluation by establishing an initial luminous density (for example 1000 cd/m²). The current required for this luminous density is kept constant, while, typically, the voltage increases and the luminous density decreases. The lifetime has been reached when the initial luminous density has dropped to 50% of the initial value.

The results obtained on use of polymers P1 to P7 and C1 to C4 and blends thereof in PLEDs are shown in the Examples below. Examples 15 and 16 here relate to PLEDs comprising individual emitting polymers and Examples 17 to 21 relate to PLEDs comprising polymer blends.

Example 15

Comparison of Polymers P1 to P3 According to the Invention with Comparative Polymer C1

The results obtained on use of P1 to P3 and C1 in PLEDs are shown in Table 1. These cases involve white-emitting polymers.

TABLE 1

| Polymer | U @ 100 cd/m² [V] | Max. eff. [cd/A] | CIE [x/y] | Lifetime @ 1000 cd/m² [h] |
|---|---|---|---|---|
| C1 | 7.1 | 7.6 | 0.32/0.38 | 1900 |
| P1 | 4.9 | 7.8 | 0.41/0.42 | 4500 |
| P2 | 4.8 | 8.2 | 0.40/0.41 | 5000 |
| P3 | 4.9 | 8.0 | 0.41/0.41 | 4800 |

As can be seen from the results, polymers P1 to P3 according to the invention represent a significant improvement compared with the comparable polymer in accordance with the prior art with respect to operating voltage, efficiency and lifetime.

Example 16

Comparison of Polymer P4 According to the Invention with Comparative Polymer C2

The results obtained on use of P4 and C2 in PLEDs are shown in Table 2. Both cases involve white-emitting polymers.

TABLE 2

| Polymer | U @ 100 cd/m² [V] | Max. eff. [cd/A] | CIE [x/y] | Lifetime @ 1000 cd/m² [h] |
|---|---|---|---|---|
| C2 | 6.5 | 9.4 | 0.31/0.38 | 1900 |
| P4 | 4.0 | 13.1 | 0.36/0.41 | 4000 |

As can be seen from the results, polymer P4 according to the invention represent a significant improvement compared with the comparable polymer in accordance with the prior art with respect to operating voltage, efficiency and lifetime.

Example 17

Comparison of a Blend According to the Invention Comprising Polymer P1 and Comparative Polymer C2 with the Individual Components The results obtained on use of P1 and C2 and a 50:50 blend thereof in PLEDs are shown in Table 3. Both cases involve white-emitting polymers.

TABLE 3

| Polymer | U @ 100 cd/m² [V] | Max. eff. [cd/A] | CIE [x/y] | Lifetime @ 1000 cd/m² [h] |
|---|---|---|---|---|
| C2 | 6.5 | 9.4 | 0.31/0.38 | 1900 |
| P1 | 4.9 | 7.8 | 0.41/0.42 | 4500 |
| P1 + C2 | 3.8 | 12.1 | 0.36/0.38 | 6500 |

As can be seen from the results, the performance data of a comparative polymer C2 corresponding to the prior art can be increased not only by the incorporation of monomers according to the invention (i.e. conversion into polymer P4 according to the invention, see Example 16). An even greater increase in the performance data can be achieved by the preparation of blends of the corresponding comparative polymer with a polymer according to the invention.

Example 18

Comparison of a Blend According to the Invention of Polymer P5 and Comparative Polymer C2 with the Individual Components The results obtained on use of P5 and C2 and a 38:62 blend thereof in PLEDs are shown in Table 4. These are a white-emitting comparative polymer and a blue-emitting polymer according to the invention.

TABLE 4

| Polymer | U @ 100 cd/m² [V] | Max. eff. [cd/A] | CIE [x/y] | Lifetime @ 1000 cd/m² [h] |
|---|---|---|---|---|
| C2 | 6.5 | 9.4 | 0.31/0.38 | 1900 |
| P5 | 4.0 | 6.9 | 0.17/0.32 | 350 |
| P5 + C2 | 3.1 | 16.0 | 0.31/0.38 | 6500 |

As can be seen from the results, a blend according to the invention of a comparative polymer C2 and a polymer P5 according to the invention is a multiple superior to the comparative polymer corresponding to the prior art. This applies, in particular, to operating voltage, power efficiency and lifetime. This increase in the performance data can be achieved, although it is not possible to produce particularly efficient or long-lived PLEDs from polymer P5 according to the invention (in contrast to polymers P1 to P4 according to the invention considered hitherto) as pure substance.

Example 19

Comparison of a Blend According to the Invention of Polymer P6 and Comparative Polymer C1 with the Individual Components The results obtained on use of P6 and C1 and a 17:73 blend thereof in PLEDs are shown in Table 5. These are a white-emitting comparative polymer and a blue-emitting polymer according to the invention.

TABLE 5

| Polymer | U @ 100 cd/m$^2$ [V] | Max. eff. [cd/A] | CIE [x/y] | Lifetime @ 1000 cd/m$^2$ [h] |
|---|---|---|---|---|
| C1 | 7.1 | 7.6 | 0.32/0.38 | 1900 |
| P6 | 4.3 | 2.1 | 0.16/0.31 | 50 |
| P6 + C1 | 4.0 | 12.5 | 0.34/0.38 | 6500 |

As can be seen from the results, a blend according to the invention of a comparative polymer C1 and a polymer P6 according to the invention is a multiple superior to the comparative polymer corresponding to the prior art. This applies, in particular, to operating voltage, power efficiency and lifetime. This increase in the performance data can be achieved, although it is not possible to produce particularly efficient or long-lived PLEDs from polymer P6 according to the invention (in contrast to polymers P1 to P4 according to the invention considered initially) as pure substance.

Example 20

Comparison of a Blend According to the Invention of Polymer P7 and Comparative Polymer C3 with the Individual Components The results obtained on use of P7 and C3 and a 50:50 blend thereof in PLEDs are shown in Table 6. A blue-emitting comparative polymer and a white-emitting polymer according to the invention are involved.

TABLE 6

| Polymer | U @ 100 cd/m$^2$ [V] | Max. eff. [cd/A] | CIE [x/y] | Lifetime @ 1000 cd/m$^2$ [h] |
|---|---|---|---|---|
| P7 | 3.8 | 13.4 | 0.40/0.45 | 3200 |
| C3 | 5.6 | 6.1 | 0.15/0.19 | 600 |
| P7 + C3 | 3.3 | 14.6 | 0.36/0.41 | 9000 |

As can be seen from the results, the performance data of a polymer P7 according to the invention can be further increased by using it not as the pure substance, but instead as a component of a blend according to the invention (with a comparative polymer C3). This applies, in particular, to the lifetime and power efficiency, but also to the quantum efficiency and operating voltage.

Example 21

Comparison of a Blend According to the Invention of Polymer P6 and Comparative Polymer C4 with the Individual Components The results obtained on use of P6 and C4 and a 50:50 blend thereof in PLEDs are shown in Table 7. A green-emitting comparative polymer and a blue-emitting polymer according to the invention are involved.

TABLE 7

| Polymer | U @ 100 cd/m$^2$ [V] | Max. eff. [cd/A] | CIE [x/y] | Lifetime @ 1000 cd/m$^2$ [h] |
|---|---|---|---|---|
| C4 | 6.4 | 15.1 | 0.32/0.59 | 9200 |
| P6 | 4.3 | 2.1 | 0.16/0.31 | 50 |
| P6 + C4 | 3.1 | 18.1 | 0.29/0.52 | 13200 |

As can be seen from the results, a blend according to the invention of a comparative polymer C4 and a polymer P6 according to the invention is clearly superior to the comparative polymer corresponding to the prior art. This applies, in particular, to power efficiency and operating voltage. This increase in the performance data can be achieved although particularly efficient or long-lifetime PLEDs cannot be produced from polymer P6 according to the invention (in contrast to polymers P1 to P4 according to the invention considered initially) as pure substance.

The invention claimed is:

1. A copolymer comprising structural units of general formula (I)

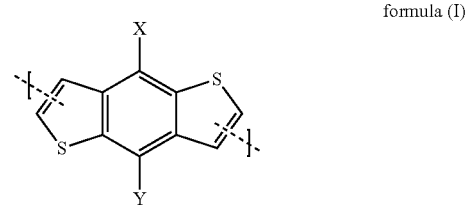

formula (I)

and an aromatic structural unit selected from the group consisting of 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, wherein:

X and Y are on each occurrence independently selected from naphthyl, anthracenyl, phenanthrenyl, dihydrophenanthrenyl, biphenyl, terphenyl, fluorenyl, spirobifluorenyl, cis- or trans-indenofluorenyl, truxenyl, isotruxenyl, spirotruxenyl, spiroisotruxenyl, carbazolyl, pyridinyl, quinolinyl, or isoquinolinyl, wherein one or more H atoms are optionally replaced by R, and wherein one of the two groups X or Y is optionally R;

R is identically or differently on each occurrence D, F, Cl, Br, I, N(Ar$^1$)$_2$, C(=O)Ar$^1$, P(=O)Ar$^1$$_2$, S(=O)Ar$^1$, S(=O)$_2$Ar$^1$, CR$^1$=CR$^1$Ar$^1$, CN, NO$_2$, Si(R$^1$)$_3$, B(OR$^1$)$_2$, OSO$_2$R$^1$, a straight-chain alkyl, alkoxy or thioalkoxy group having 1 to 40 C atoms, or a branched or cyclic alkyl, alkoxy or thioalkoxy group having 3 to 40 C atoms, each of which is optionally substituted by one or more radicals R$^1$, wherein one or more non-adjacent CH$_2$ groups is optionally replaced by R$^1$C=CR$^1$, C≡C, Si(R$^1$)$_2$, Ge(R$^1$)$_2$, Sn(R$^1$)$_2$, C=O, C=S, C=Se, C=NR$^1$, P(=O)(R$^1$), SO, SO$_2$, NR$^1$, O, S, or CONR$^1$, and wherein one or more H atoms is optionally replaced by F, Cl, Br, I, CN, or NO$_2$;

Ar$^1$ is identically or differently on each occurrence an aryl or heteroaryl group or an aromatic or heteroaromatic ring system; and R$^1$ is identically or differently on each occurrence H, an aliphatic hydrocarbon radical having 1 to 20 C atoms, or an aromatic hydrocarbon radical having 6 to 20 C atoms;

wherein the H atom present in each case in one or both of the thiophene rings is optionally replaced by R; and wherein the dashed lines, represent the bonds to the adjacent structural units in the copolymer.

2. The copolymer of claim 1, wherein X and/or Y are substituted by one or more linear alkyl or alkoxy radicals having 1 to 12 C atoms, branched alkyl or alkoxy radicals having 3 to 12 C atoms or cyclic alkyl or alkoxy radicals having 6 to 12 C atoms, or by one or more aryl, heteroaryl, aryloxy or heteroaryloxy groups.

3. The copolymer of claim 1, wherein the structural unit of the formula (I) is present in the range from 0.2 to 80 mol %.

4. The copolymer of claim 3, wherein said further structural unit is a hole-injection, hole-transport, hole-blocking, electron-injection, electron-transport, electron-blocking, emitter, exciton-generating unit, backbone unit, or combination thereof.

5. The copolymer of claim 3, further comprising structural units with derivatized molecular groups, the molecular groups selected from the group consisting of triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan.

6. The copolymer of claim 5 having a HOMO greater than −5.8 eV as measured against vacuum level.

7. A blend comprising the copolymer of claim 1 and a different polymer, oligomer, dendrimer, or low-molecular-weight compound.

8. An organic electronic device comprising the blend of claim 7.

9. A formulation comprising the blend of claim 7 and one or more solvents.

10. An organic electronic device comprising one or more layers, wherein at least one layer comprises the blend of claim 7.

11. The organic electronic device of claim 10, wherein said one or more layers comprise one or more hole-injection layer, hole-transport layer, hole-blocking layer, electron-injection layer, electron-transport layer, electron-blocking layer, charge-generation or emitter layer, a layer which comprises exciton-generating units, or combinations thereof.

12. The organic electronic device according to claim 10, wherein said organic electronic device is an organic electroluminescent device, a polymeric electroluminescent device, an organic integrated circuit, an organic field-effect transistor, an organic thin-film transistor, an organic light-emitting transistor, an organic solar cell, an organic optical detector, an organic photoreceptor, an organic field-quench device, a light-emitting electrochemical cell, or an organic laser diode.

13. An organic electronic device comprising the copolymer of claim 1.

14. A formulation comprising the polymer of claim 1 and one or more solvents.

15. An organic electronic device comprising one or more layers, wherein at least one layer comprises the copolymer of claim 1.

16. The organic electronic device of claim 15, wherein said one or more layers comprise one or more hole-injection layer, hole-transport layer, hole-blocking layer, electron-injection layer, electron-transport layer, electron-blocking layer, charge-generation or emitter layer, a layer which comprises exciton-generating units, or combinations thereof.

17. The organic electronic device according to claim 15, wherein said organic electronic device is an organic electroluminescent device, a polymeric electroluminescent device, an organic integrated circuit, an organic field-effect transistor, an organic thin-film transistor, an organic light-emitting transistor, an organic solar cell, an organic optical detector, an organic photoreceptor, an organic field-quench device, a light-emitting electrochemical cell, or an organic laser diode.

18. An organic electroluminescent device comprising the copolymer of claim 1.

19. The copolymer of claim 1 wherein at least one of X and Y is selected from naphthyl or anthracenyl.

20. An organic electronic device comprising one or more layers, wherein at least one layer comprises the copolymer of claim 19.

21. The copolymer of claim 19, further comprising structural units of group 1 that include molecular groups selected from the group consisting of triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan.

22. The copolymer of claim 1, wherein the structural units of general formula (I) is present in the copolymer from 0.5 to 60 mol %, and the copolymer has a molecular weight in the range from 10,000 to 2,000,000 g/mol, as determined from gel permeation chromatography.

23. The copolymer of claim 1, wherein the aromatic structural unit is part of the copolymer backbone.

* * * * *